United States Patent
Chen et al.

(10) Patent No.: US 8,324,785 B2
(45) Date of Patent: Dec. 4, 2012

(54) PIEZOELECTRIC ACTUATORS

(75) Inventors: Ya-Mei Chen, Berkeley, CA (US); Michael Stephen Sheppy, Alameda, CA (US); Matthew A. Hopcroft, San Francisco, CA (US); Albert P. Pisano, Danville, CA (US); Rajesh Vinodrai Mehta, Rochester, NY (US); Michael Alan Marcus, Honeoye Falls, NY (US); Gilbert Allan Hawkins, Mendon, NY (US)

(73) Assignee: The Regents of the University of California, Oakland, CA (US)

( * ) Notice: Subject to any disclaimer, the term of this patent is extended or adjusted under 35 U.S.C. 154(b) by 479 days.

(21) Appl. No.: 12/615,826

(22) Filed: Nov. 10, 2009

(65) Prior Publication Data
US 2011/0107962 A1    May 12, 2011

(51) Int. Cl.
*H01L 41/09* (2006.01)
(52) U.S. Cl. .................. 310/328; 310/330; 310/331
(58) Field of Classification Search .......... 310/317, 310/328, 330–332
See application file for complete search history.

(56) References Cited

U.S. PATENT DOCUMENTS

| | | | |
|---|---|---|---|
| 5,266,862 A | 11/1993 | Ohya | |
| 6,333,587 B1 | 12/2001 | Heinz et al. | |
| 6,799,745 B2 | 10/2004 | Schmauser et al. | |
| 6,977,461 B2 * | 12/2005 | Hendriks et al. | 310/328 |
| 7,446,457 B2 * | 11/2008 | Ikehashi | 310/330 |
| 7,580,226 B2 | 8/2009 | Yao et al. | |
| 7,588,307 B2 | 9/2009 | Hong et al. | |
| 7,589,921 B2 | 9/2009 | Kwan et al. | |
| 2008/0231143 A1 * | 9/2008 | Chen et al. | 310/328 |

FOREIGN PATENT DOCUMENTS

JP   59-99977 A  *  6/1984  ................... 310/12

OTHER PUBLICATIONS

Conway et al., "A strain amplifying piezoelectric MEMS actuator", J. Micromech Microeng. 17 (2007) 781-787.
Dogan et al, "Composite Piezoelectric Transducer with Truncated Conical Endcaps 'Cymbol'", IEEE Transactions on Ultrasonics, Ferroelectrics, and Frequency Control, vol. 44, No. 3, May 1997, pp. 597-605.
Ervin et al., "Recurve Piezoelectric-Strain-Amplifying Actuator Architecture", IEEE/ASME Transactions on Mechatronics, vol. 3, No. 4, Dec. 1998, pp. 293-301.
Kawakita et al., "Multi-Layered Piezoelectric Bimorph Actuator", (1997) International Symposium on Micromechatronics and Human Science, pp. 73-78.
Seidemann et al., "Fabrication and investigation of in-plane compliant SU8 structures for MEMS and their application to micro valves and micro grippers", Sensor and Actuator A 97-98 (2002) 457-461.
Sinclair, "A High Force Low Area MEMS Thermal Actuator", Inter Society Conference on Thermal Phenomena, pp. 127-132 (2000).

* cited by examiner

*Primary Examiner* — Thomas Dougherty
(74) *Attorney, Agent, or Firm* — Bret E. Field; Rudy J. Ng; Bozicevic Field & Francis LLP

(57) ABSTRACT

Piezoelectric actuators are provided. In some instances, the piezoelectric actuators are high-precision piezoelectric actuators. The piezoelectric beams may have a bi-chevron configuration. Also provided are methods of making the piezoelectric actuators, e.g., using Micro-Electro-Mechanical System (MEMS) fabrication techniques, and methods of using the piezoelectric actuators, e.g., as valves in fluid dispensing systems.

18 Claims, 18 Drawing Sheets

PIEZOELECTRIC ACTUATORS

REFERENCE TO GOVERNMENT SUPPORT

This invention was made in part with government support under a grant from the Defense Advanced Research Projects Agency (DARPA)/Army Research Office (ARO) (Award No. W911QX-06-C-0097). The government has certain rights in this invention.

INTRODUCTION

Actuators are a type of transducer and can be mechanical devices for moving or controlling a mechanism or system. Actuators typically take energy and convert it into force or motion. Certain types of actuators convert electrical energy input into mechanical energy output. Micro-Electro-Mechanical (MEMS) actuators have feature sizes on the order of 1-1000 μm and may be fabricated using the micromachining techniques developed for the integrated circuit industry.

Piezoelectricity is the ability of some materials (for instance, crystals and certain ceramics) to generate an electric potential in response to applied mechanical stress. The piezoelectric effect is reversible in that materials exhibiting a direct piezoelectric effect (i.e., the production of an electric potential when stress is applied) can also exhibit a reverse piezoelectric effect (i.e., the production of stress and/or strain when an electric field is applied). For example, lead zirconate titanate (PZT) crystals will exhibit a shape change from their original dimension upon application of an electric field.

SUMMARY

Piezoelectric actuators are provided. In some embodiments, the piezoelectric actuators are high-precision piezoelectric actuators. The piezoelectric beams may have a bi-chevron configuration. Also provided are methods of making the piezoelectric actuators, e.g., using Micro-Electro-Mechanical System (MEMS) fabrication techniques, and methods of using the piezoelectric actuators, e.g., as valves in fluid dispensing systems.

BRIEF DESCRIPTION OF THE FIGURES

FIG. 2 also shows a schematic of the expansion and contraction of a piezoelectric material in the presence of an electric field opposite to and in the same direction as the polarization of the piezoelectric material.

DETAILED DESCRIPTION

Figure 1:
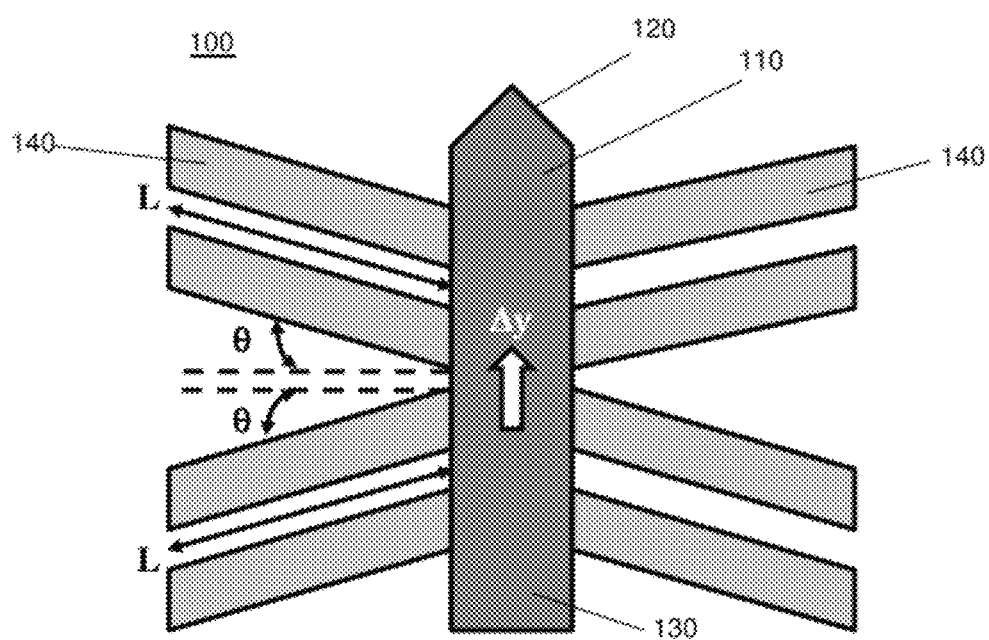
FIG. 1 shows a schematic of an embodiment of a subject piezoelectric actuator.

Piezoelectric actuators are provided. In some embodiments, the piezoelectric actuators are high-precision piezoelectric actuators. The piezoelectric beams may have a bi-chevron configuration. Also provided are methods of making the piezoelectric actuators, e.g., using Micro-Electro-Mechanical System (MEMS) fabrication techniques, and methods of using the piezoelectric actuators, e.g., as valves in fluid dispensing systems.

Below, piezoelectric actuators in accordance with embodiments of the invention are described first in greater detail. In addition, methods of making piezoelectric actuators are disclosed, followed by a review of the various applications in which the piezoelectric actuators may find use.

Piezoelectric Actuators

Provided are piezoelectric actuators. Piezoelectric actuators are actuators that include a piezoelectric material. Piezoelectric materials produce a force or motion upon application of an electric field. For example, application of an electric field to a piezoelectric material may cause the piezoelectric material to expand. Alternatively, application of an electric field to the piezoelectric material may cause the piezoelectric material to contract. Whether the piezoelectric material expands or contracts upon application of an electric field depends on the direction of the applied electric field relative to the polarization of the piezoelectric material. In some instances, the piezoelectric material expands in length and contracts in thickness when the direction of the applied electric field is opposite the direction of polarization of the piezoelectric material. Where desired, the expansion of the piezoelectric material in the length direction may be used to exert a positive force in the direction of the expansion. In some cases, the piezoelectric material contracts in length and expands in thickness when the direction of the applied electric field is in the same direction as the direction of polarization of the piezoelectric material. Where desired, the contraction of the piezoelectric material in the length direction may be used to exert a negative force in the direction of the contraction.

The piezoelectric actuator may include the piezoelectric material. As such, application of an electric field to the piezoelectric material causes the piezoelectric actuator to produce a force or motion as the piezoelectric material expands in the length direction (i.e., exerts a positive force) or contracts in the length direction (i.e., exerts a negative force), as described above. In some cases, the piezoelectric actuator includes a piezoelectric portion and an actuating portion. In certain embodiments, the piezoelectric portion includes the piezoelectric material and is connected to the actuating portion. Application of an electric field to the piezoelectric portion may cause the piezoelectric portion to produce a force or motion that is transferred to the actuating portion of the piezoelectric actuator, thus causing the actuating portion to exert a corresponding force or motion.

The piezoelectric actuators can be high-precision piezoelectric actuators. By "high-precision" is meant that actuation of the piezoelectric actuator occurs substantially along the direction of actuation. For instance, in some cases, actuation of the piezoelectric actuator may occur substantially along the longitudinal axis of the elongated structure. Embodiments of high-precision piezoelectric actuators may have a minimum out-of-plane displacement during actuation. Embodiments of high-precision piezoelectric actuators may also substantially maintain their shape during actuation. As such, the piezoelectric actuators may have a minimum of buckling during actuation. By "buckling" is meant bending of an elongated structure along its longitudinal axis, such that the elongated structure is deformed from its original shape.

In certain embodiments, the piezoelectric actuator can include an elongated structure. The elongated structure may include a piezoelectric material. In other embodiments, the piezoelectric actuators have an actuating portion, such as an elongated structure, and a piezoelectric portion, such as piezoelectric beams, coupled to the elongated structure. The piezoelectric actuators may have an elongated structure with first and second sets of piezoelectric beams each coupled at a first end to the elongated structure and at a second end to a fixed support. In certain embodiments, the piezoelectric actuators can have a bi-chevron design. The term "bi-chevron" is meant to describe the arrangement of the piezoelectric beams in relation to the actuating portion of the piezoelectric actuator. The first and second sets of piezoelectric beams may be arranged such that they are coupled to the elongated structure in a first and a second chevron configuration. The first and second chevron configurations may be arranged as opposing chevron configurations with the first set of piezoelectric beams angled towards one end of the elongated structure and the second set of piezoelectric beams angled towards the opposite end of the elongated structure. In some cases, the bi-chevron design may amplify the actuation stroke and can allow for higher actuation forces and frequencies. In addition, in certain instances, the bi-chevron design of the piezoelectric actuators facilitates a minimization of the out-of-plane displacement and buckling of the actuator. In certain embodiments, the piezoelectric actuators can be used in micro-scale applications.

An embodiment of the subject piezoelectric actuator is shown in FIG. 1. The piezoelectric actuator 100 depicted in FIG. 1 includes an actuating portion, such as an elongated structure 110. By elongated is meant that the elongated structure has a length that is greater than its width. The length of the elongated structure can be 2, 3, 4, 5, 6, 7, 8, 9, 10, 15, 20, 25, 30, 35, 40, 45, or 50 times, or more greater than the width of the elongated structure. For example, the length of the elongated structure can range from 1 to 100 times greater than the width of the elongated structure, such as from 5 to 75, including from 10 to 50, for instance, from 15 to 30 times greater than the width of the elongated structure. In certain embodiments, the piezoelectric actuator is included in a micro-fluidic system. Accordingly, the elongated structure can have a length ranging from 10 to 500 µm, such as 50 to 400 µm, including 100 to 300 µm, and a width ranging from 1 to 50 µm, such as 5 to 25 µm, including 5 to 15 µm. In some instances, the elongated structure has a length of 230 µm and a width of 10 µm. Where desired, the elongated structure may have a thickness ranging from 1 to 100 µm, such as from 1 to 50 µm, including from 1 to 25 µm, for example from 1 to 10 µm. The cross-section of the elongated structure may be any desired shape, including, but not limited to, square, rectangular, triangular, circular, elliptical, and the like. The cross-sectional area of the elongated structure may range from 1 to 10,000 $\mu m^2$, such as from 10 to 5000 $\mu m^2$, 50 to 2500 $\mu m^2$, 50 to 1000 $\mu m^2$, 50 to 500 $\mu m^2$, for example from 50 to 250 $\mu m^2$. In some instances the cross-sectional area of the elongated structure is 100 $\mu m^2$.

The elongated structure can have a first end 120 and a second end 130, where the first end and the second end of the elongated structure are arranged on opposing ends of the elongated structure. For example, in some cases, the first end and second end of the elongated structure are arranged at opposing ends of the longitudinal axis of the elongated structure. In certain embodiments, the ends of the elongated structure can have a shape, such as a flat, cubic, rectangular, rounded, pyramidal, or conical shape, and the like.

The piezoelectric actuators of the present disclosure include two or more sets of opposing piezoelectric beams 140 coupled to the elongated structure. By set is meant two or more piezoelectric beams, such as 2, 4, 6, 8, 10, 12, 14, 16, 18, 20, or more piezoelectric beams. By opposing is meant that the piezoelectric beams are coupled to the elongated structure on opposite sides of the elongated structure, such that each piezoelectric beam is coupled to the elongated structure across from another piezoelectric beam. Each piezoelectric beam has a first end and a second end and is configured to provide an actuation force to the elongated structure by being coupled at the first end to the elongated structure and at the second end to a fixed support, such as a substrate. The elongated structure is not directly attached to the substrate and is supported above the substrate by the piezoelectric beams. Thus, movement of the piezoelectric beams will be transferred to the elongated structure, causing the elongated structure to be displaced from its original position.

In certain embodiments, a first set of opposing piezoelectric beams can be coupled to the elongated structure, where each piezoelectric beam of the first set is coupled at a first end to a first region of the elongated structure and at a second end to a fixed support. In addition, a second set of piezoelectric beams can be coupled to the elongated structure, where each piezoelectric beam of the second set is coupled at a first end to a second region of the elongated structure and at a second end to a fixed support. The first and second sets of piezoelectric beams are configured to move the elongated structure along its longitudinal axis upon application of an electric field.

The sets of piezoelectric beams can be arranged in a chevron pattern. In these embodiments, the piezoelectric beams can be coupled at a first end to the elongated structure at an angle to the longitudinal axis of the elongated structure. The piezoelectric beams can be coupled to the elongated structure in substantially parallel rows on opposing sides of the elongated structure, such that the piezoelectric beams are arranged in a chevron pattern. This type of chevron pattern is also known as a "V-shaped" or "bent-beam" pattern.

Figure 2:
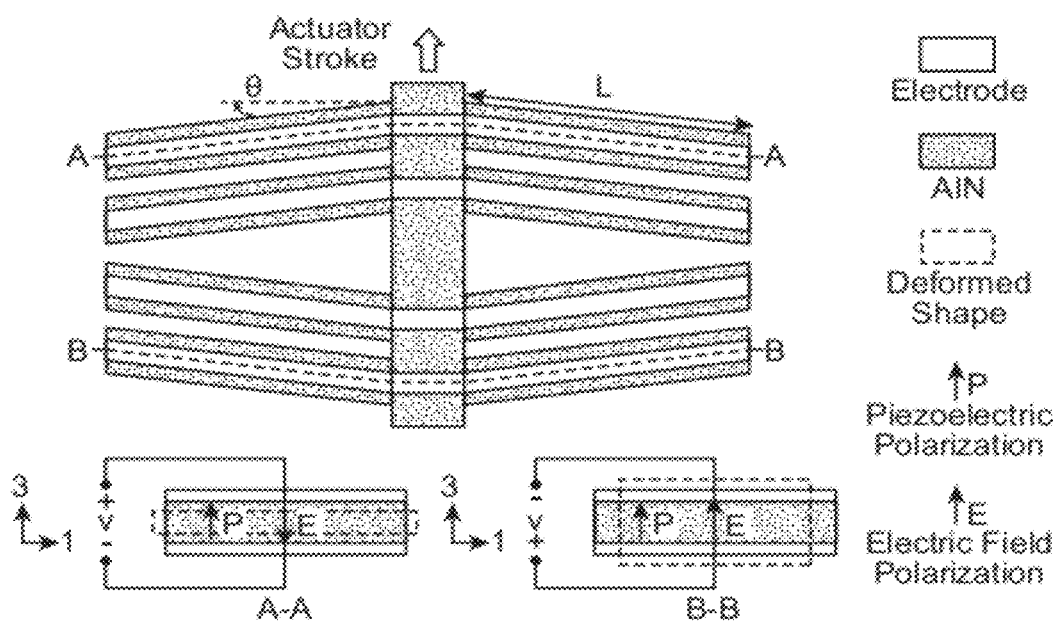
FIG. 2 shows a schematic of another embodiment of the subject piezoelectric actuator. The first and second sets of piezoelectric beams are actuated with opposite electric fields to "push and pull" the elongated structure at substantially the same time.

In certain embodiments, the first and second sets of piezoelectric beams can be arranged in a bi-chevron pattern (see FIGS. 1 and 2). For instance, the first and second sets of piezoelectric beams can be arranged such that the orientation of the first set of piezoelectric beams relative to the elongated structure is opposite the orientation of the second set of piezoelectric beams relative to the elongated structure. For example, each of piezoelectric beams of the first set can be arranged such that the piezoelectric beams are angled towards one end of the elongated structure, and each of the piezoelectric beams of the second set can be arranged such that the piezoelectric beams are angled towards the opposite end of the elongated structure. Stated another way, the first and second sets of piezoelectric beams can be arranged in a pattern, such that the pattern of the first set of piezoelectric beams is the mirror image of the pattern of the second set of piezoelectric beams.

The bi-chevron configuration of the sets of opposing piezoelectric beams enables a push and pull actuation in both directions. In some instances, this configuration can facilitate a minimization of out-of-plane displacement and buckling of the piezoelectric actuator. By out-of-plane displacement is meant a displacement of at least a portion of the piezoelectric actuator away from the plane of the piezoelectric actuator. The out-of-plane displacement can be positive or negative. The out-of-plane displacement may depend on various factors, such as, but not limited to, the length of the piezoelectric beams, the method of actuation (e.g., push-pull, pull-pull, etc.), the actuation voltage, the actuation frequency, and the like. In certain embodiments, the piezoelectric actuator has a maximum out-of-plane displacement of 0.1 μm or less, such as 0.05 μm or less, including 0.03 μm or less. In some cases, the piezoelectric actuator has substantially no out-of-plane displacement.

The bi-chevron configuration of the sets of opposing piezoelectric beams may facilitate an amplification of the displacement of the elongated structure. For example, if ΔL is the elongation of the piezoelectric beam when actuated and Δy is the displacement of the elongated structure (i.e., the actuating stroke), then the piezoelectric actuator is configured such that Δy is greater than ΔL when actuated (see FIG. 3).

The normalized displacement (Δy/L) and normalized actuator force (P/F) of a single piezoelectric beam can be expressed as functions of the beam angle (θ):

$$\frac{\Delta y}{L} = -\sin\theta + \sqrt{\left(1 + \frac{\Delta L}{L}\right)^2 - (\cos\theta)^2} \quad (1)$$

$$\frac{P}{F} = \sin\theta \quad (2)$$

where L is the length of a beam, ΔL is the elongation of the piezoelectric beam when actuated, Δy is the actuating stroke, P is the force applied in the direction of actuation, F is the force generated by the piezoelectric beam due to the applied electric field, and θ is the "beam angle", the angle between the piezoelectric beam and a line perpendicular to the longitudinal axis of the elongated structure. In certain embodiments, the actuating stroke, Δy, ranges from 0.1 to 10 μm, such as from 0.5 to 5 μm, including from 1 to 1.5 μm. The force, P, applied in the direction of actuation can range from 1 to 1000 μN, such as from 5 to 500 μN, including from 10 to 300 μN. The elongation of the piezoelectric beam, ΔL, can range from 0.001 to 10 μm, including from 0.01 to 5 μm, such as from 0.05 to 1 μm. In certain embodiments, the piezoelectric beams are configured to exert an actuation force, F, on the elongated structure ranging from 100 to 4000 μN, such as from 200 to 2500 μN, including from 300 to 1500 μN.

Each of the piezoelectric beams may be coupled to the elongated structure at an angle. In some cases, the angle is measured as the angle between the piezoelectric beam and a line perpendicular to the longitudinal axis of the elongated structure (i.e., the beam angle). The beam angles of the first set of piezoelectric beams and the second set of piezoelectric beams may be of the same magnitude. As described above, the first and second sets of piezoelectric beams may be angled towards opposite ends of the elongated structure. Thus, in some instances, the beam angles of the first and second sets of piezoelectric beams may be of the same magnitude but the first and second sets of piezoelectric beams may be angled in opposite directions.

In some cases, the beam angle is measured as the angle between the piezoelectric beam and a line perpendicular to the longitudinal axis of the elongated structure. The beam angle may be an acute angle and can range from 1° to 15°, for example from 1° to 10°, or from 1° to 5°. In some instances, the beam angle is 4°, as measured between the piezoelectric beam and a line perpendicular to the longitudinal axis of the elongated structure.

Figure 4:
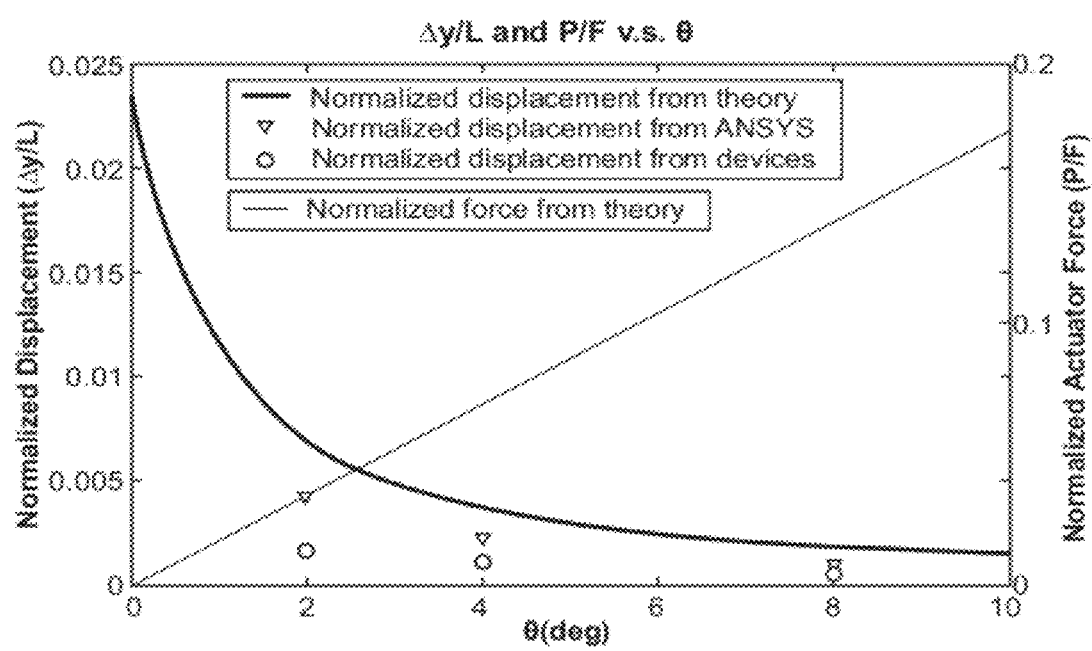
FIG. 4 shows a graph of the normalized displacement (Δy/L) and normalized actuator force (P/F) vs. the beam angle, θ, for an embodiment of the subject piezoelectric actuator.
Figure 5:
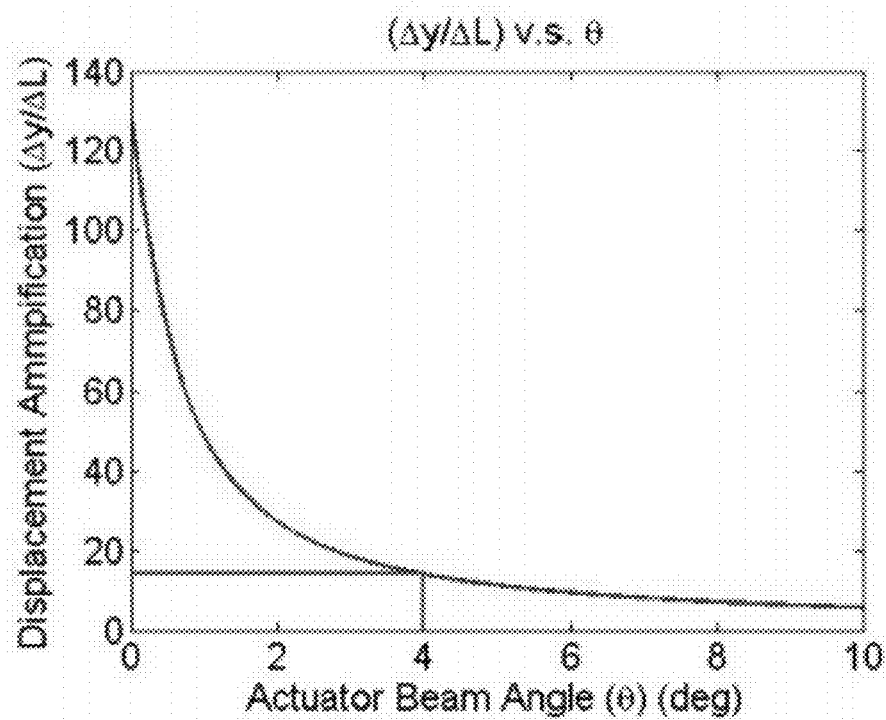
FIG. 5 shows a graph of the displacement amplification (Δy/ΔL) vs. the beam angle, θ, for an embodiment of the subject piezoelectric actuator.
Figure 6:
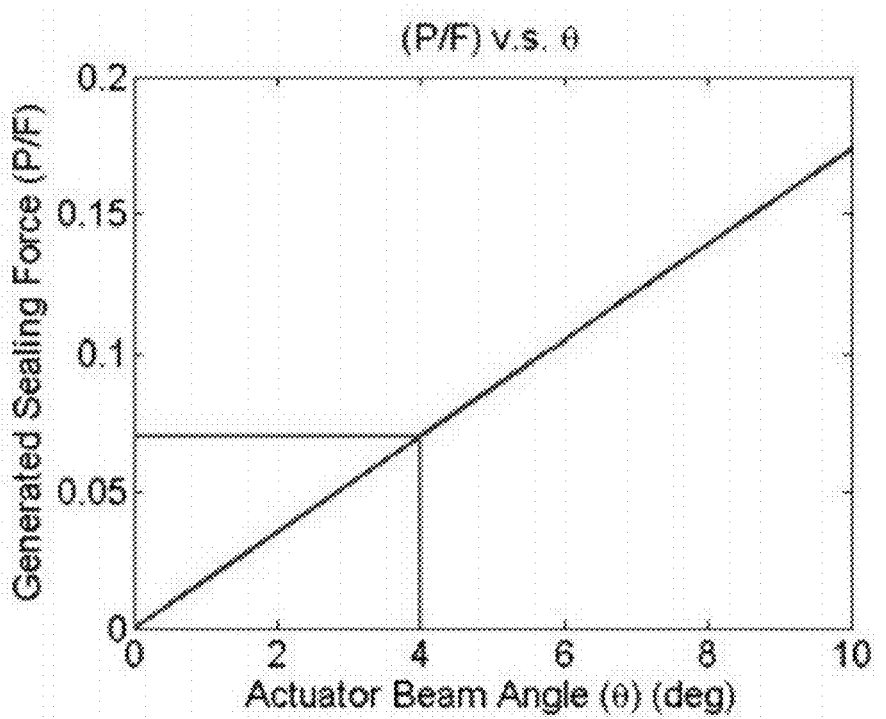
FIG. 6 shows a graph of the normalized actuator force (P/F) vs. the beam angle, θ, for an embodiment of the subject piezoelectric actuator.

The normalized displacement and the normalized actuator force can be plotted vs. the beam angle (see FIGS. 4-6). As can be seen in FIGS. 4-6, as the beam angle, θ, decreases, the displacement amplification (Δy/ΔL) increases. However, as the beam angle, θ, decreases, the normalized actuator force (P/F) also decreases. Thus, in some instances, the beam angle, θ, represents a trade-off between the actuator force in the direction of actuation and displacement amplification. Where desired, the beam angle may be selected such that the piezoelectric beams have sufficient displacement amplification, while at the same time generating a desired force on the elongated structure in the direction of actuation and minimizing the length of the actuator. In certain embodiments, the displacement amplification (Δy/ΔL) ranges from 1 to 500, such as from 10 to 300, including from 15 to 150. For example, the displacement amplification (Δy/ΔL) can be 15 when the beam angle is 4°, as measured between the piezoelectric beam and a line perpendicular to the longitudinal axis of the elongated structure. In some instances, the normalized actuator force (P/F) ranges from 0.01 to 1, such as from 0.02 to 0.5, including from 0.05 to 0.2. For instance, the normalized actuator force (P/F) can be 0.07 when the beam angle is 4°, as measured between the piezoelectric beam and a line perpendicular to the longitudinal axis of the elongated structure.

Because the piezoelectric beams are attached to a fixed support at one end and the elongated structure at the other end, the positive and negative forces generated by the piezoelectric beams will be transferred to the elongated structure as movement of the elongated structure relative to the original position of the elongated structure. Thus, upon application of an electric field to the piezoelectric beams, the piezoelectric beams change shape (e.g., expand or contract in the length direction) and cause the elongated structure to be displaced from its original position. Whether the piezoelectric beams expand or contract in the length direction in response to an applied electric field depends on the direction of the applied electric field and the polarization of the piezoelectric beams (FIG. 2). For instance, if the direction of the applied electric field is opposite the direction of polarization of the piezoelectric beams, then the piezoelectric beams will expand in the length direction. The expansion of the piezoelectric beams may be used to exert a positive force on the elongated structure (i.e., the piezoelectric beams are configured to "push" the elongated structure). If the direction of the applied electric field is in the same direction as the direction of polarization of the piezoelectric beams, then the piezoelectric beams will contract in the length direction. The contraction of the piezoelectric beams may be used to exert a negative force on the elongated structure (i.e., the piezoelectric beams are configured to "pull" the elongated structure).

Thus, in certain embodiments, the piezoelectric actuator includes first and second sets of opposing piezoelectric beams configured to move the elongated structure along its longitudinal axis. The piezoelectric beams can move the elongated structure in a forward direction when the direction of the applied electric field is opposite the direction of polarization of the first set of opposing piezoelectric beams and in the same direction as the direction of polarization of the second set of opposing piezoelectric beams. In this case, because the direction of the applied electric field is opposite the direction of polarization of the first set of opposing piezoelectric beams, the first set of piezoelectric beams will exert a positive force on the elongated structure. In addition, because the applied electric field is in the same direction as the direction of polarization of the second set of opposing piezoelectric beams, the second set of piezoelectric beams will exert a negative force on the elongated structure. The positive force from the first set of piezoelectric beams and the negative force from the second set of piezoelectric beams work together to move the elongated structure in a forward direction along its longitudinal axis.

In addition, the piezoelectric beams can move the elongated structure in a reverse direction when the direction of the applied electric field is in the same direction as the direction of polarization of the first set of opposing piezoelectric beams and is opposite the direction of polarization of the second set of opposing piezoelectric beams. Here, because the direction of the applied electric field is in the same direction as the direction of polarization of the first set of opposing piezoelectric beams, the first set of piezoelectric beams will exert a negative force on the elongated structure. In addition, because the applied electric field is opposite the direction of polarization of the second set of opposing piezoelectric beams, the second set of piezoelectric beams will exert a positive force on the elongated structure. The negative force from the first set of piezoelectric beams and the positive force from the second set of piezoelectric beams work together to move the elongated structure in a reverse direction along its longitudinal axis.

In certain embodiments, the piezoelectric beams are configured to move the elongated structure along its longitudinal axis a distance ranging from 0.1 to 25 µm, for instance from 0.1 to 10 µm, such as from 0.5 to 5 µm, including from 1 to 1.5 µm from the position of the elongated structure in the absence of an applied electric field. In certain instances, the piezoelectric beams are configured to move the elongated structure along its longitudinal axis a distance of 1.2 µm.

Figure 3:
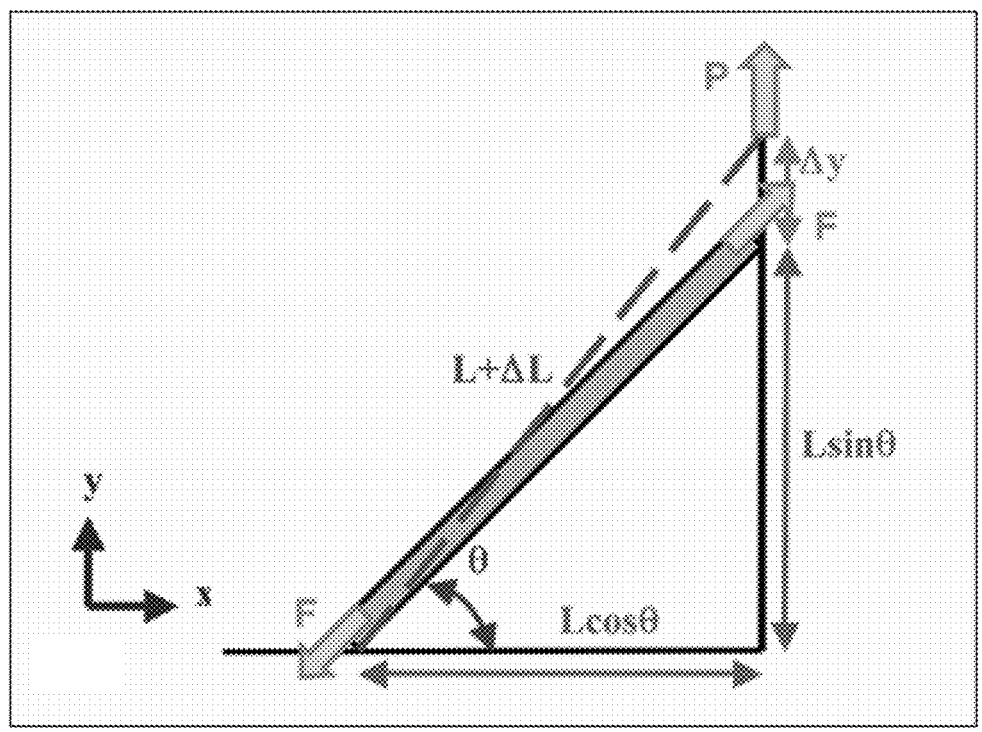
FIG. 3 shows a schematic of the mechanism of actuation for an embodiment of the subject piezoelectric actuator.

The piezoelectric beams can have lengths that are substantially the same. For example, in certain embodiments, each of the piezoelectric beams has a length ranging from 50 to 2000 µm, such as from 200 to 1500 µm, including from 500 to 1000 µm. In some cases, each of the piezoelectric beams has a length of 700 µm. As can be seen in FIG. 3, in some instances, the length and angle of the piezoelectric beams determines the displacement of the elongated structure.

The piezoelectric beams may be fabricated from any suitable piezoelectric material. Examples of piezoelectric materials include, but are not limited to aluminum nitride, lead zirconate titanate (PZT), berlinite, quartz, topaz, tourmaline-group minerals, gallium orthophosphate, langasite, barium titanate, lead titanate, potassium niobate, lithium niobate, lithium tantalite, sodium tungstate, $Ba_2NaNb_5O_5$, $Pb_2KNb_5O_{15}$, sodium potassium niobate, bismuth ferrite, sodium niobate, and the like. In certain embodiments, the piezoelectric beams include aluminum nitride.

Aluminum nitride is a hard piezoelectric material (Moh's hardness of 7 at 20° C.) and is capable of generating relatively large forces during actuation. Sputtered aluminum nitride can be deposited as intrinsically piezoelectric, and thus it requires no poling and can withstand high compressive stress without significant compressive-stress depolarization. In addition, aluminum nitride is compatible with complementary metal-oxide-semiconductor (CMOS) technology. Aluminum nitride's compatibility with CMOS technology allows for integration of the piezoelectric actuators with control circuitry.

The piezoelectric strain coefficient, $d_{31}$, for aluminum nitride is $1.73 \times 10^{-12}$ m/V. Thus, in embodiments that include aluminum nitride as the piezoelectric material, for every volt/meter of electric field applied across the actuator, the aluminum nitride piezoelectric beam will increase fractionally in length by $1.73 \times 10^{-12}$ m. The maximum voltage that can be applied is given in terms of the breakdown electric field for the material ($E_B$), which for aluminum nitride is 1400 kV/cm. By "breakdown electric field" or "breakdown field" is meant the maximum electric field strength that a material can withstand without experiencing a failure of its intrinsic piezoelectric properties. In certain embodiments, the applied voltage does not create a field greater than half the breakdown field.

In some cases, the piezoelectric beams are coupled to an electrode. For instance, each piezoelectric beam can be coupled to an electrode. The electrodes may facilitate the delivery of an electric field to the piezoelectric beams. Application of the electric field to the piezoelectric beams may effect actuation of the piezoelectric beams. The electrodes can include any conductive material compatible with the piezoelectric material and the fabrication process described in more detail below. For example, in certain embodiments, the electrodes can include platinum, aluminum, gold, molybdenum, and the like. In some instances, the electrodes can include platinum. In certain cases, the electrodes can include aluminum. In some cases, a layer of gold is disposed over the electrodes. The layer of gold may facilitate an increase in the durability of the electrodes.

In certain embodiments, the piezoelectric beam is a multi-layer piezoelectric beam, where the piezoelectric beam includes two or more layers. The piezoelectric beam may include one or more layers of a piezoelectric material and one or more electrode layers. In some cases, the piezoelectric beam includes alternating layers of the piezoelectric material and electrode layers. For example, the piezoelectric beam can include a first electrode layer, a first piezoelectric layer disposed over the first electrode layer, a second electrode layer disposed over the first piezoelectric layer, a second piezoelectric layer disposed over the second electrode layer, and a third electrode layer disposed over the second piezoelectric layer. The piezoelectric beam can include more or fewer layers as desired.

In certain embodiments, the subject piezoelectric actuators find use in a variety of applications. For instance, the piezoelectric actuators may find use as valves, such as piezoelectric valves.

Piezoelectric Valves

Figure 7:
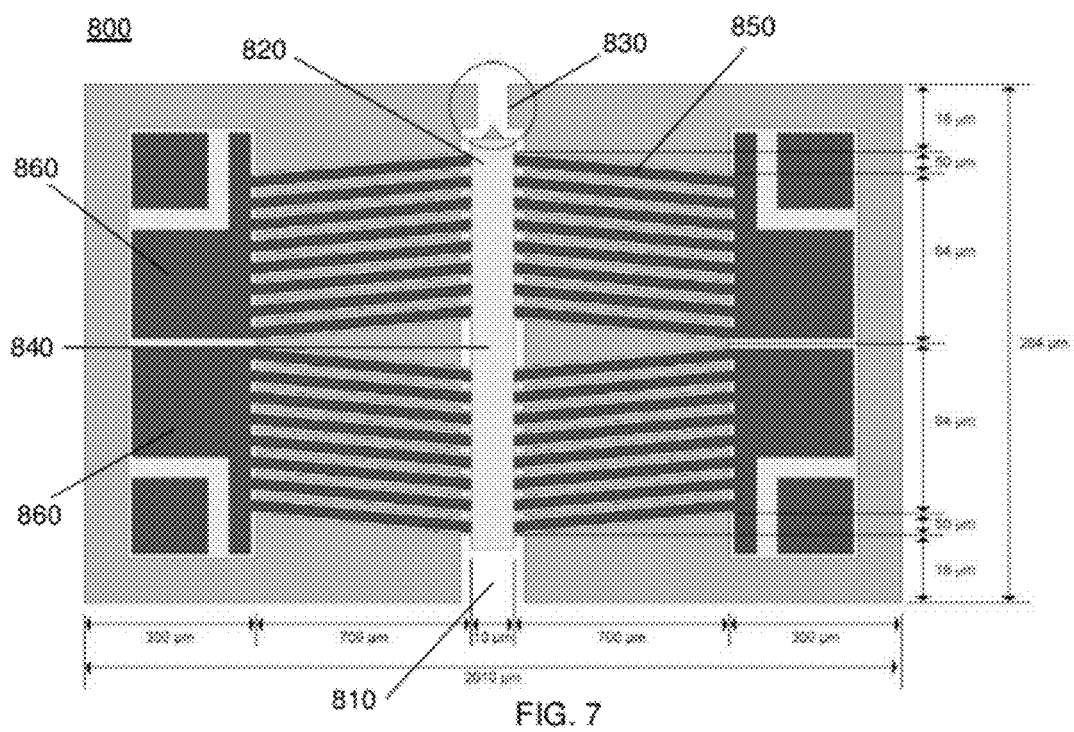
FIG. 7 shows a schematic of an embodiment of a subject piezoelectric valve with certain dimensions indicated.

Embodiments also include piezoelectric valves (see FIG. 7). Valves regulate the flow of a fluid (e.g., gases, liquids, slurries, etc.) through a conduit by opening, closing, or partially obstructing the conduit. In certain embodiments, the piezoelectric valve can be included in a device for regulating the flow of a fluid through a conduit. For example, a piezoelectric valve can be positioned in a conduit having a first end and a second end. In certain embodiments, the device can also include a valve seat positioned at the first end of the conduit. In some embodiments, the piezoelectric valve includes an elongated structure with first and second sets of piezoelectric beams each coupled at a first end to the elongated structure and at a second end to a fixed support. In some cases, the piezoelectric valve can have a bi-chevron design, as described above.

In certain embodiments, the devices can be micro-fluidic devices. As such, the conduit can have a width ranging from 1 to 100 μm, such as 1 to 50 μm, including 1 to 25 μm. Where desired, the conduit may have a thickness ranging from 1 to 100 μm, such as from 1 to 50 μm, including from 1 to 25 μm. The cross-section of the conduit may be any desired shape, including, but not limited to, square, rectangular, triangular, circular, elliptical, and the like. The cross-sectional area of the conduit may range from 1 to 10,000 $\mu m^2$, such as from 10 to 5000 $\mu m^2$, 50 to 2500 $\mu m^2$, 50 to 1000 $\mu m^2$, 50 to 500 $\mu m^2$, for example from 50 to 250 $\mu m^2$. The elongated structure may be spaced apart from the conduit. In some instances, the conduit is configured to carry the flow of a fluid in the space between the elongated structure and the conduit. As such, there may be a distance between the elongated structure and the inner side wall of the conduit, which in some cases, ranges from 0.5 to 25 $\mu m^2$, such as from 1 to 10 $\mu m^2$, including from 1 to 5 $\mu m^2$. In certain embodiments, the distance between the elongated structure and the inner side wall of the conduit is 2 $\mu m^2$.

FIG. 7 shows a schematic of an embodiment of a device that includes a piezoelectric valve. In some cases, the device 800 includes a piezoelectric valve 820 positioned in a conduit 810. The device 800 can also include a valve seat 830 positioned at one end of the conduit. The piezoelectric valve 820 includes an elongated structure 840 and a plurality of piezoelectric beams 850 coupled to the elongated structure 840 in a bi-chevron configuration. In addition, the piezoelectric valve 820 includes electrodes 860 coupled to the piezoelectric beams.

Figure 8:
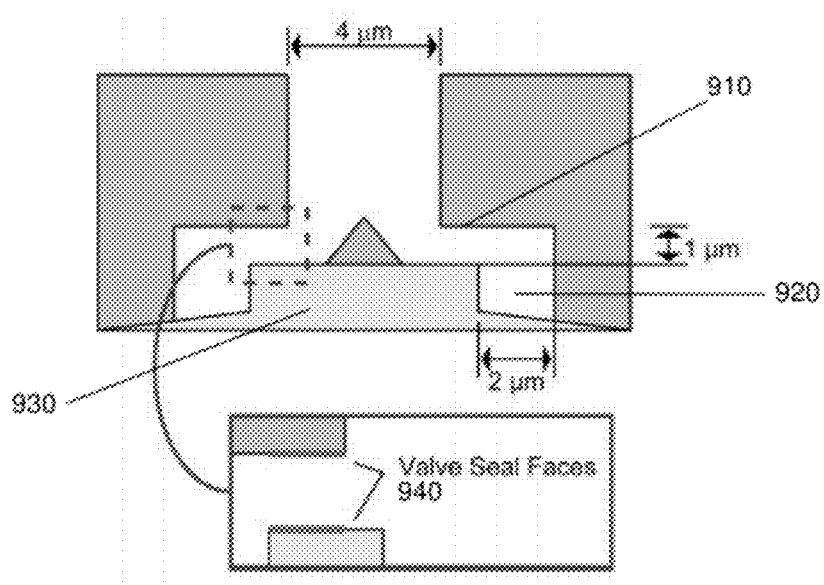
FIG. 8 shows a detail view of the valve seat of an embodiment of the subject piezoelectric valve with certain dimensions indicated.

Embodiments of the subject devices also include a valve seat 910 positioned at the first end of the conduit 920 (see FIG. 8). The valve seat 910 is adapted to contact the end of the elongated structure 930 and form a seal against the surface of the elongated structure that contacts the valve seat. The valve seat 910 and the elongated structure 930 include valve seal faces 940 where the valve seat 910 and elongated structure 930 contact each other when the valve is in a closed position. In some cases, the elongated structure is also known as a "plug" or "valve plug". In certain embodiments, when the piezoelectric valve is in a closed position, the valve seat contacts the elongated structure with sufficient force to substantially seal the piezoelectric valve against the flow of the fluid through the conduit. In some instances, substantially no fluid is able to pass through the piezoelectric valve when it is in the closed position.

In addition, the device can include a piezoelectric valve positioned in the conduit. The piezoelectric valve can include an elongated structure having a first end proximal to the valve seat and a second end distal to the valve seat. The device can also include first and second sets of opposing piezoelectric beams, as described in detail above. In some cases, the first and second sets of opposing piezoelectric beams are arranged in a bi-chevron configuration, as described above.

The first and second sets of opposing piezoelectric beams can be configured to move the elongated structure along its longitudinal axis in a manner dependent on the direction of the applied electric field and the polarization of the first and second sets of piezoelectric beams. In certain embodiments, the piezoelectric beams are configured to move the elongated structure along its longitudinal axis in a direction towards the valve seat. In these cases, the direction of the applied electric field is opposite the direction of polarization of the first set of opposing piezoelectric beams and in the same direction as the direction of polarization of the second set of opposing piezoelectric beams. Thus, the first set of piezoelectric beams can be configured to push the elongated structure towards the valve seat and the second set of piezoelectric beams can be configured to pull the elongated structure towards the valve seat. In this configuration, the first and second sets of piezoelectric beams can move the elongated structure towards the valve seat such that the elongated structure contacts the valve seat, thus closing the piezoelectric valve against the flow of the fluid through the conduit.

In some instances, the piezoelectric beams are configured to move the elongated structure along its longitudinal axis in a direction away from the valve seat. In these cases, the direction of the applied electric field is in the same direction as the direction of polarization of the first set of opposing piezoelectric beams and opposite the direction of polarization of the second set of opposing piezoelectric beams. Thus, the first set of piezoelectric beams can be configured to pull the elongated structure away from the valve seat and the second set of piezoelectric beams can be configured to push the elongated structure away from the valve seat. In this configuration, the first and second sets of piezoelectric beams can move the elongated structure away from the valve seat such that the elongated structure does not contact the valve seat, thus opening the piezoelectric valve to the flow of the fluid through the conduit.

In some instances, the displacement of the elongated structure, and thus the force the elongated structure can exert on the valve seat, depends on the length of the piezoelectric beams, the angle of the piezoelectric beams, the cross-section of the piezoelectric beams, and the applied electric field (e.g., the actuating voltage). In addition, the elongated structure may be positioned in the conduit in the fluid flow. In some cases, the fluid in the conduit has a pressure ranging from 5 to 100 MPa, such as from 10 to 50 MPa, including from 10 to 40 MPa. In certain instances, the fluid in the conduit has a pressure of 30 MPa. As such, when the piezoelectric valve is in a closed position, the force the elongated structure of the piezoelectric valve exerts on the valve seat may be greater than the pressure of the fluid in the conduit in order to maintain a tight seal of the piezoelectric valve against the valve seat. Stated another way, the force applied in the direction of actuation (i.e., the sealing force, P) should be large enough such that the elongated structure contacts the valve seat with enough force so that substantially no fluid is able to pass through the piezoelectric valve when it is in the closed position. Similarly, in certain embodiments, when the piezoelectric valve is in a closed position, the piezoelectric beams can actuate the elongated structure with enough force to overcome the pressure of the fluid and open the piezoelectric valve. The piezoelectric actuator may be configured to contact the valve seat with a sealing force (P) ranging from 1 to 1000 μN, such as from 5 to 500 μN, including from 10 to 300 μN.

The number of piezoelectric beams needed to overcome the pressure of the fluid flow can be calculated using the following equation:

$$2 \times N_b \times F_b \times \sin\theta = A_p \times (P_2 - P_1) \quad (3)$$

where $N_b$ is the number of piezoelectric beams needed for each side, $F_b$ is the force that a piezoelectric beam can exert, $A_p$ is the cross-sectional area of the elongated structure (where the pressure difference will apply), and $P_1$ and $P_2$ are the pressures for the different plug cross-sections. $F_b$ can be estimated by the following equation:

$$F_b = \sigma \times A_b = \sigma \times (t \times w) = (E_3 \times e_{31}) \times (t \times w) \quad (4)$$

where σ is the stress at the piezoelectric beam cross section, $A_b$ is the cross-sectional area of the piezoelectric beam, $E_3$ is the electric field in the thickness direction, $e_{31}$ is the piezoelectric stress coefficient, t is the thickness of the piezoelectric beam, and w is the width of the piezoelectric beam. In certain embodiments, the cross-sectional area $A_p$ of the elongated structure ranges from 1 to 1000 μm², such as from 10 to 500 μm², including from 50 to 250 μm². In some instances, the cross-sectional area $A_p$ of the elongated structure is 100 μm². Embodiments of the subject piezoelectric beams may have widths ranging from 1 to 100 μm, such as from 1 to 50 μm, including from 1 to 25 μm, for example from 1 to 15 μm. In certain embodiments, the piezoelectric beams have a width of 12 μm. In some instances, the piezoelectric beams have a thickness ranging from 1 to 100 μm, such as from 1 to 50 μm, including from 1 to 25 μm, for example from 1 to 10 μm. Where desired, the piezoelectric beams may have a thickness of 3 μm.

In addition, for a given flow rate, the required area of the valve opening can be estimated from the expression:

$$\frac{1}{2}\rho V_1^2 + P_1 = \frac{1}{2}\rho V_2^2 + P_2 \quad (5)$$

where $V_1$ and $V_2$ are the velocity at two different sections of the flow and ρ is the density of the fluid. If $V_2$, the upstream velocity, is presumed to be zero, which in some instances is a conservative estimate, the following equation can be derived:

$$P_2 - P_1 = \frac{1}{2}\rho V_1^2 = \frac{1}{2}\rho \left(\frac{Q}{A}\right)^2 \quad (6)$$

where Q is the volume flow rate and A is the area of the opening of the valve. The above equation can be modified to determine an expression for the area of the valve opening:

$$A = \frac{Q}{\sqrt{\left(\frac{2\times(P_2-P_1)}{\rho}\right)}} = \frac{\dot{m}}{\sqrt{2\times\rho\times(P_2-P_1)}} \quad (7)$$

where $\dot{m}$ is the mass flow rate.

For example, the piezoelectric valve may be configured to accommodate a fluid flow rate ranging from 1 to 100 mg/sec, such as from 5 to 50 mg/sec, including from 5 to 20 mg/sec when the piezoelectric valve is in the open position. In certain instances, the piezoelectric valve is configured to accommodate a fluid flow rate of 10 mg/sec when the piezoelectric valve is in the open position. In addition, the valve opening area may range from 1 to 1000 μm², such as from 10 to 500 μm², including from 10 to 250 μm², for example from 10 to 100 μm². In some instances, the valve opening area is 40 μm².

As described in more detail below, the fluid may include supercritical $CO_2$. In certain embodiments, the density of supercritical $CO_2$ is a function of temperature and pressure. For example, the density of supercritical $CO_2$ may range from 0.1 to 2 g/cm³, including from 0.3 to 1.5 g/cm³, such as from 0.6 to 1 g/cm³. As described above, in some cases, the fluid in the conduit has a pressure of 30 MPa. Thus, based on the above equations, the valve opening area A should be 40 μm² in order to accommodate a fluid flow rate of 10 mg/sec when the density, ρ, for liquid $CO_2$ is 1.03 g/cm³ ($P_1$ is 0.1 MPa and $P_2$ is 30 MPa).

Figure 9:
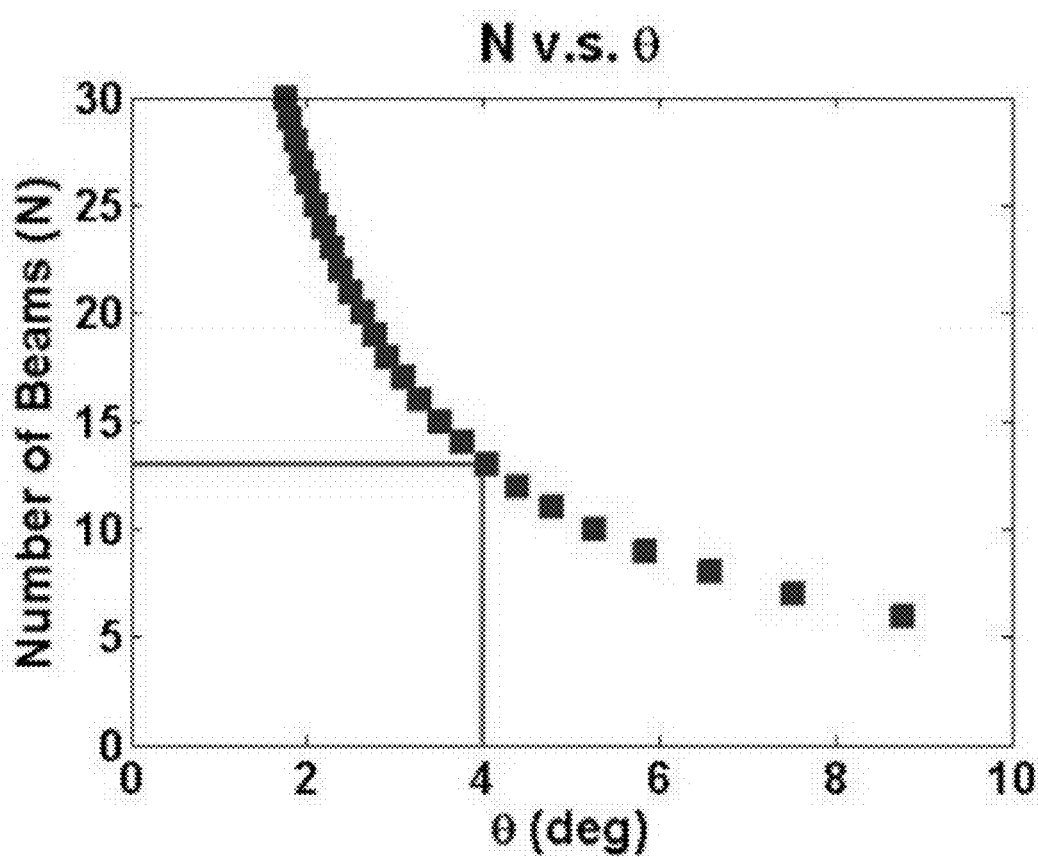
FIG. 9 shows a graph of the number of piezoelectric beams needed to overcome 30 MPa of fluid pressure for a given beam angle, θ.

From the calculations above, the number of piezoelectric beams required to overcome 30 MPa of fluid pressure for a given θ are shown in FIG. 9. The data in FIG. 9 are plotted for the following dimensions: the cross-sectional area $A_p$ of the elongated structure is 100 μm², the width w and thickness t of the piezoelectric beams are 12 μm and 3 μm, respectively. From FIG. 9, at least 14 piezoelectric beams are needed for a beam angle of 4° to generate the minimum force necessary to close the valve against 30 MPa of fluid pressure. In some instances, fewer or greater than 14 piezoelectric beams may be included in the device depending on the particular requirements of the device. For instance, the device can include 2, 4, 6, 8, 10, 12, 14, 16, 18, 20, or more piezoelectric beams. In certain embodiments, the piezoelectric beams are configured to exert an actuation force (F) on the elongated structure ranging from 100 to 4000 μN, such as from 200 to 2500 μN, including from 300 to 1500 μN.

The fluidic resistance of a valve is the ratio of the flow of the fluid through the valve when the valve is open to the flow of the fluid through the valve when the valve is closed. The fluidic resistance of a valve represents a measure of the amount of fluid that is able to pass through and/or around the valve when the valve is closed (i.e., the amount of valve leakage). In certain embodiments, the subject piezoelectric valves have a fluidic resistance of 2:1 or greater, 3:1 or greater, 4:1 or greater, 10:1 or greater, 100:1 or greater, 1000:1 or greater, 2000:1 or greater, 3500:1 or greater, 5000:1 or greater, or 10,000:1 or greater.

Systems for Dispensing a Fluid

Figure 10:
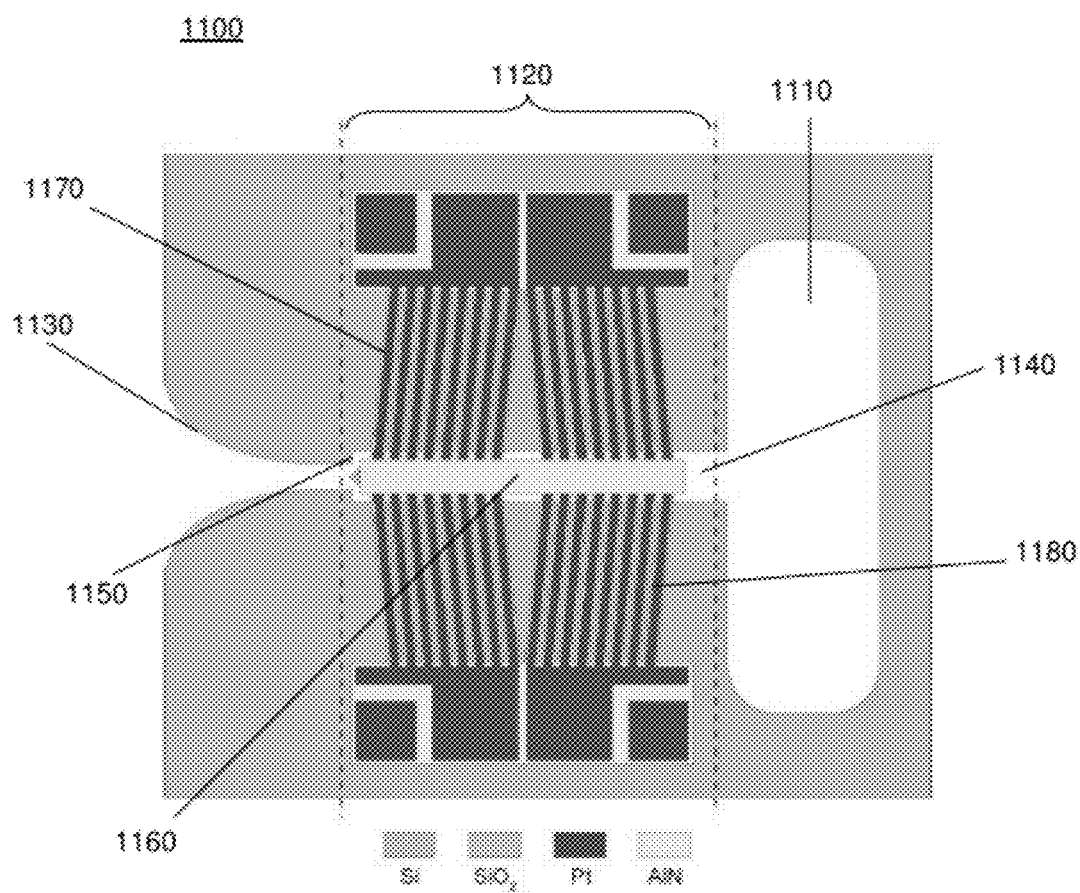
FIG. 10 shows a schematic of a system for dispensing a fluid according to an embodiment of the present invention.

Additional embodiments include systems for dispensing a fluid 1100, as shown in FIG. 10. The systems include a fluid reservoir 1110, a piezoelectric valve 1120, and a nozzle 1130. In some instances, the system 1100 includes a conduit 1140 in fluid communication with the fluid reservoir 1110, a valve seat 1150 positioned at a first end of the conduit 1140. The piezoelectric valve 1120 is disposed between the fluid reservoir 1110 and the nozzle 1130. Embodiments of the piezoelectric valve are as described above. For instance, the piezoelectric valve 1120 can include an elongated structure 1160 having a first end proximal to the valve seat and a second end distal to the valve seat. In addition, the piezoelectric valve 1120 may include first 1170 and second 1180 sets of opposing piezoelectric beams coupled to the elongated structure 1160 in a bi-chevron configuration.

In certain embodiments, the fluid reservoir includes a fluid. The fluid reservoir can include a fluid having a pressure greater than standard atmospheric pressure. For example, the fluid reservoir may include a fluid having a pressure ranging from 5 to 100 MPa, such as from 10 to 50 MPa, including from 10 to 40 MPa. In certain instances, the fluid reservoir includes a fluid having a pressure of 30 MPa. In embodiments where the fluid reservoir includes a fluid having a pressure greater than atmospheric pressure, the system is configured such that fluid will flow through the nozzle of the system when the piezoelectric valve is opened. Where desired, the system may include a piezoelectric valve configured to accommodate a fluid flow rate of 1 to 100 mg/sec, such as 5 to 50 mg/sec, including 5 to 20 mg/sec when the piezoelectric valve is in an open position. In some instances, the system includes a piezoelectric valve configured to accommodate a fluid flow rate of 10 mg/sec when the piezoelectric valve is in an open position.

Various types of fluids can be used in the subject systems. For example, the fluid reservoir can include fluids such as, but not limited to, gases, liquids, slurries, and the like. In certain embodiments, the fluid reservoir can include a supercritical fluid, such as, but not limited to, supercritical $CO_2$, $NH_3$, $H_2O$, $N_2O$, ethane, and the like. By supercritical fluid is meant a fluid that is at or above both its critical temperature and critical pressure. For example, supercritical fluids have properties like a gas and a liquid, such as expanding to fill its container like a gas but with a density like that of a liquid. In certain embodiments, the fluid reservoir can include supercritical $CO_2$.

Other embodiments include systems for dispensing a fluid where the fluid includes particles and where the system is configured to deposit the particles onto a surface of a substrate. Thus, the fluid dispensed by the system may include particles, such as, but not limited to, organic, inorganic, metallo-organic, polymeric, oligomeric, metallic, alloy, ceramic, a synthetic and/or natural polymer, mixtures thereof, and the like. For example, the fluid can include particles, such as colorants (including dyes and pigments), agricultural chemicals, commercial chemicals, fine chemicals, pharmaceutically useful compounds, food items, nutrients, pesticides, photographic chemicals, explosives, cosmetics, protective agents, metal coating precursors, or other industrial substances whose desired form is that of a deposited film or coating.

Figure 11:
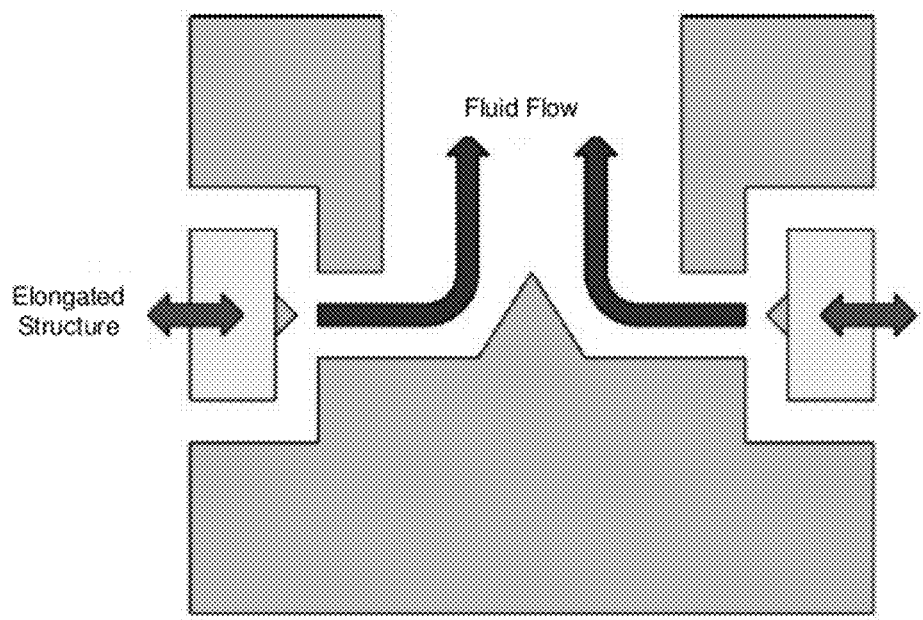
FIG. 11 shows a detail view of an embodiment of the subject piezoelectric valve, where two piezoelectric valves are in fluid communication with a single nozzle.

Systems of the present disclosure can include a plurality of piezoelectric valves in fluid communication with the nozzle. Certain embodiments of the subject systems include 2, 3, 4, 5, 6, 7, 8, 9, or 10, or more piezoelectric valves in fluid communication with a single nozzle. For example, FIG. 11 shows a schematic of an embodiment of a system that includes two piezoelectric valves in fluid communication with a single nozzle. In these embodiments, the system includes a second conduit, where a second piezoelectric valve is positioned in the second conduit. The conduit and the second conduit may be in fluid communication with the nozzle. In some cases, having two or more piezoelectric valves in fluid communication with a single nozzle facilitates an increase in the fluid flow rate from the nozzle. Alternatively, embodiments of the subject systems can include a piezoelectric valve in fluid communication with two or more nozzles. In these embodiments, actuation of a single piezoelectric valve regulates fluid flow through the two or more nozzles. Where desired, the subject systems include 2, 3, 4, 5, 6, 7, 8, 9, or 10, or more nozzles in fluid communication with a single piezoelectric valve. In some instances, the system includes 2 nozzles in fluid communication with the piezoelectric valve. In these instances, the first end of the conduit can be in fluid communication with a second and a third conduit, where the second conduit includes a first nozzle and the third conduit includes a second nozzle.

Figure 12:
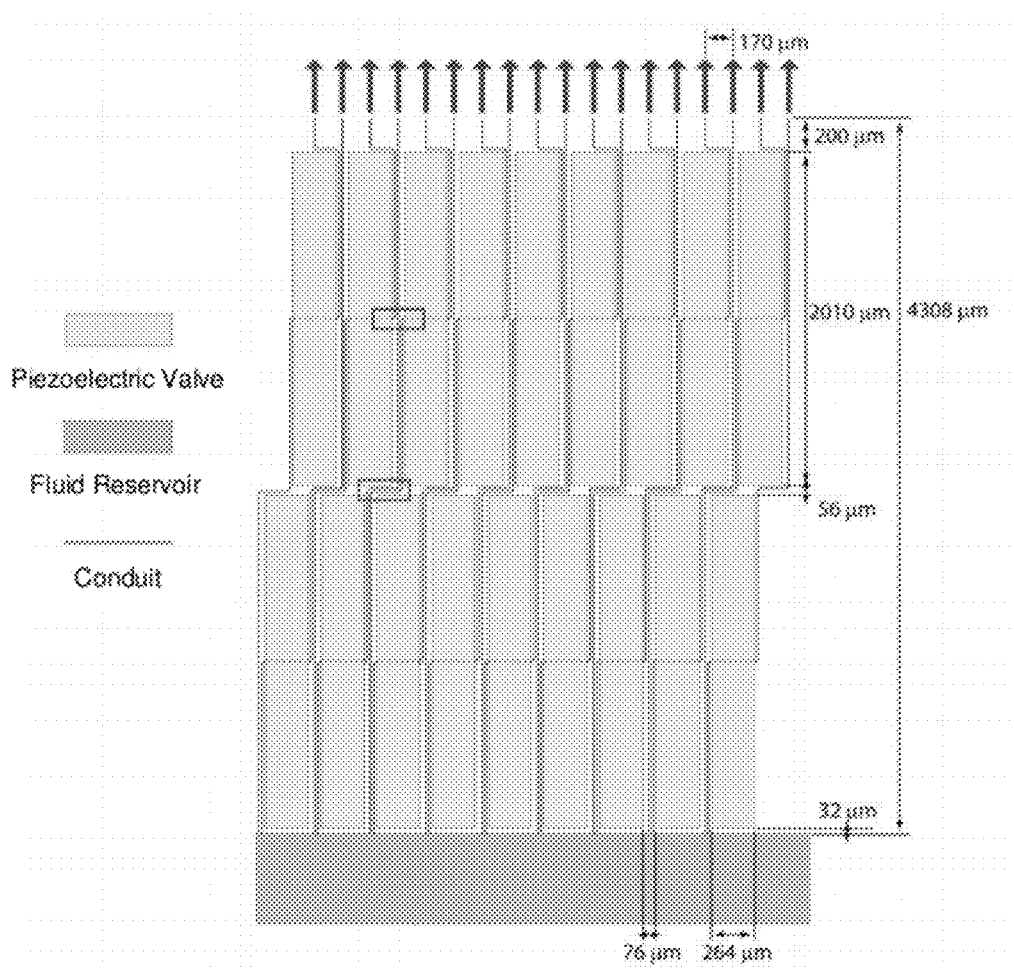
FIG. 12 shows a schematic of an embodiment of the subject system that includes a plurality of piezoelectric valves and a plurality of nozzles.

In certain embodiments, the subject systems include an array of nozzles. For instance, as shown in FIG. 12, embodiments of the subject systems can include an array of nozzles arranged with a desired spacing. Each nozzle in the array may be in fluid communication with a piezoelectric valve. The nozzles may be arranged with a spacing of 170 μm or less, such as 85 μm or less, including 42 μm or less, for example 21 μm or less, or 6.4 μm or less. Stated another way, the nozzles can be arranged such that the nozzles can deposit a fluid onto the surface of a substrate with a resolution of 150 dpi or greater, such as 300 dpi or greater, including 600 dpi or greater, for example, 1200 dpi or greater, or 4000 dpi or greater.

Figure 13:
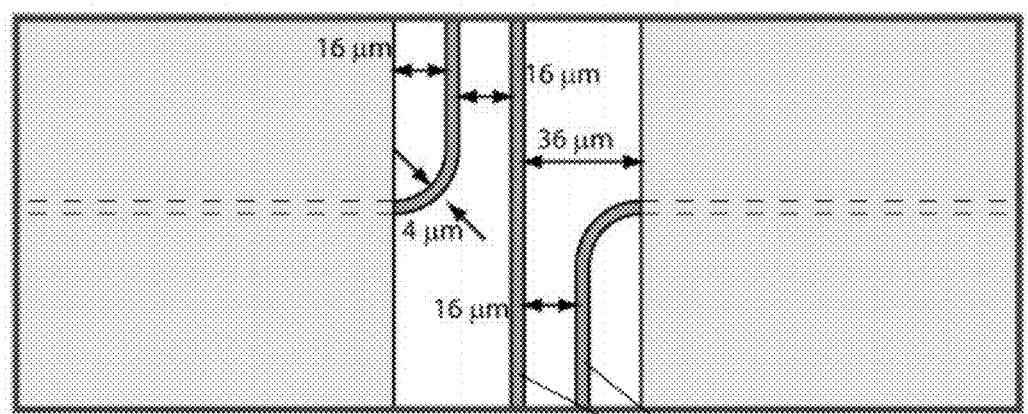
FIG. 13 shows an enlarged view of the upper detail area of FIG. 12 showing an embodiment of the subject piezoelectric valve, where the dimensions and spacing of an area of the conduits are indicated.
Figure 14:
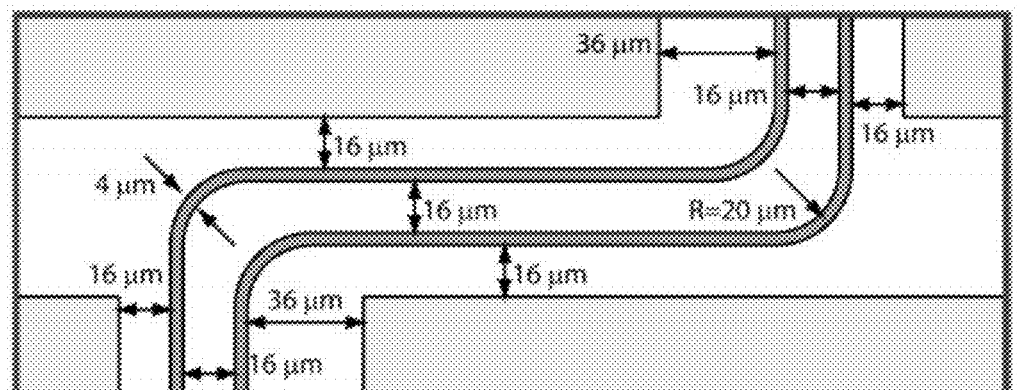
FIG. 14 shows an enlarged view of the lower detail area of FIG. 12 showing an embodiment of the subject piezoelectric valve, where the dimensions and spacing of an area of the conduits are indicated.

In certain embodiments, a plurality of piezoelectric valves are arranged on a substrate, as shown in FIG. 12. Each piezoelectric valve can be positioned in a conduit in fluid communication with a fluid supply, such as a fluid reservoir. In addition, each piezoelectric valve can be in fluid communication with a nozzle. The piezoelectric valves can be arranged on the substrate in rows perpendicular to the direction of fluid flow from the nozzles. In certain instances, this configuration for the piezoelectric valves facilitates a minimization of the spacing between the nozzles. Enlarged views of schematics for certain detail areas of the conduits are shown in FIGS. 13 and 14. The piezoelectric valves shown in FIGS. 13 and 14 include conduits 1410 and 1510, respectively. In addition, FIGS. 13 and 14 include examples of measurements for the spacing between the conduits 1410 and 1510, respectively.

In some instances, a plurality of piezoelectric valves are positioned along a conduit. A plurality of piezoelectric valves positioned along a conduit may facilitate logic-based switching or controlling of fluid flow (e.g., fluidic AND and OR logic gates). In certain embodiments, the piezoelectric valves may be arranged in series along the length of the conduit. Arrangement of the piezoelectric valves in series may facilitate the accommodation of higher pressure fluids in the system. Where desired, the piezoelectric valves may be arranged in parallel. Arrangement of the piezoelectric valves in parallel may facilitate the accommodation of higher flow rates by the system.

In certain embodiments, the system may be configured to dispense two or more different fluids. The flow of each fluid may be regulated by a corresponding piezoelectric valve and dispensed through a corresponding nozzle. In some cases, the system may be configured to contact two or more fluids with each other to form a mixture of fluids before dispensing the mixture of fluids.

Figure 15:
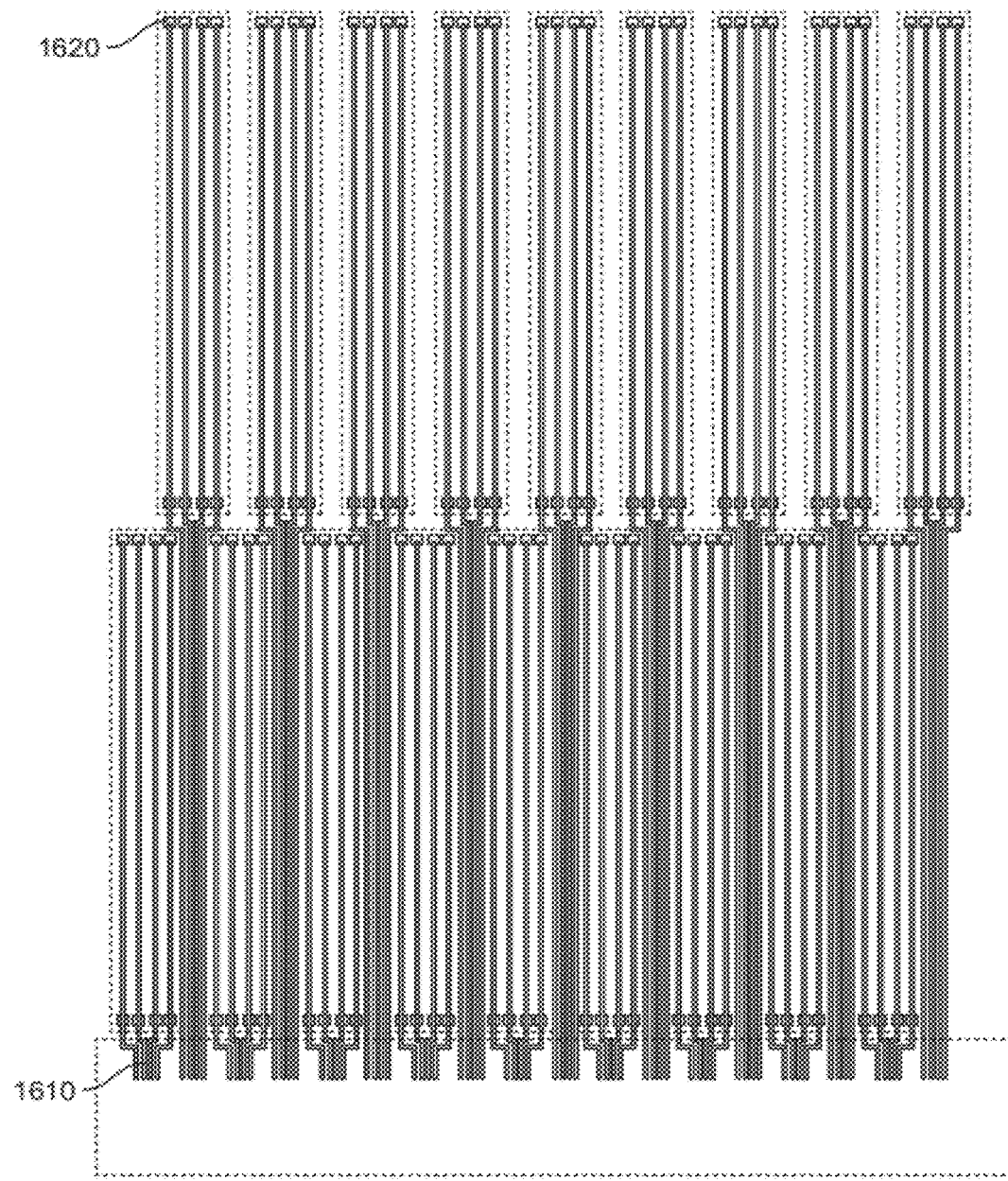
FIG. 15 shows a schematic of an embodiment of the subject system that includes a plurality of conductive traces operably connecting a controller (not pictured) to the electrodes of the piezoelectric valves.

Embodiments of the subject systems may further include a controller operably connected to the piezoelectric beams and configured to actuate the piezoelectric valve. The controller can be connected to the piezoelectric beams through conductive traces 1610, where one end of the conductive trace is connected to the controller and another end of the conductive trace is connected to the piezoelectric beam or an electrode 1620 in contact with the piezoelectric beam (see FIG. 15). The controller can be a programmed processor, where the controller is programmed to operate the piezoelectric valve to dispense a desired amount of fluid. In certain embodiments, each piezoelectric valve is in contact with a set of conductive traces, such that each piezoelectric valve can be actuated by the controller individually.

In some cases, the system also includes a display for outputting data and/or results to a user in a human-readable format. In certain instances, the system also includes a communication link for communicating with other devices, such as, but not limited to, a wired communication link (e.g., a USB, serial, Ethernet, or parallel interface, and the like), or a wireless communication link (e.g., Bluetooth, 802.11, cellular, infrared, RF, and the like).

The following sections provide additional embodiments and disclosure allowing one of skill in the art to make and use the disclosed piezoelectric actuators. Methods for making and using the piezoelectric actuators of the present disclosure are also discussed.

Methods

Provided are methods for regulating fluid flow through a conduit. In certain instances, the method includes the steps of providing a piezoelectric valve and actuating the piezoelectric valve to regulate fluid flow through the conduit. Embodiments of the piezoelectric valve are described in detail above. For instance, the piezoelectric valve can include an elongated structure and first and second sets of opposing piezoelectric beams arranged in a bi-chevron configuration. Additional embodiments can include a conduit, and a valve seat positioned at a first end of the conduit, where the piezoelectric valve is positioned in the conduit.

As described above, the first and second sets of opposing piezoelectric beams are configured to move the elongated structure along its longitudinal axis in a manner dependent on the direction of the applied electric field and the polarization of the first and second sets of opposing piezoelectric beams. For example, the actuating may include providing an electric field opposite as the direction of polarization of the first set of opposing piezoelectric beams and in the same direction as the direction of polarization of the second set of opposing piezoelectric beams. In this case, the actuating moves the elongated structure along its longitudinal axis in a direction towards the valve seat, thus closing the piezoelectric valve.

In certain embodiments, the actuating includes providing an electric field in the same direction as the direction of polarization of the first set of opposing piezoelectric beams and opposite the direction of polarization of the second set of opposing piezoelectric beams. In this case, the actuating moves the elongated structure along its longitudinal axis in a direction away from the valve seat, thus opening the piezoelectric valve.

The volume of fluid that flows through the piezoelectric valve depends on the actuation frequency of the piezoelectric valve. The greater the actuation frequency of the piezoelectric valve, the greater the volume of fluid is allowed to flow through the piezoelectric valve, and vice versa. In some instances, the piezoelectric valve is actuated with a frequency ranging from 1 to 500 kHz, such as from 1 to 250 kHz, including from 1 to 100 kHz, for example from 1 to 50 kHz, or 1 to 25 kHz. In certain cases, the piezoelectric valve is actuated with a frequency of 10 kHz.

Additional embodiments include a method of making a piezoelectric actuator. In these cases, the method includes the step of providing a piezoelectric actuator from a substrate, where the piezoelectric actuator includes an elongated structure having a first end and a second end. The piezoelectric actuator also includes a first set of opposing piezoelectric beams each coupled at a first end to a first region of the elongated structure and at a second end to a fixed support and a second set of opposing piezoelectric beams each coupled at a first end to a second region of the elongated structure and at a second end to a fixed support. The first and second sets of opposing piezoelectric beams are configured to move the elongated structure along its longitudinal axis upon application of an electric field. In addition, the method of making the piezoelectric actuator includes the step of releasing the elongated structure from the substrate.

In certain embodiments, the providing the piezoelectric actuator includes: etching the substrate in a pattern of an elongated structure; contacting the substrate with a first electrode layer, where the first electrode layer is disposed over the substrate; contacting the first electrode layer with a piezoelectric layer, where the piezoelectric layer is disposed over the first electrode layer; contacting the piezoelectric layer with a second electrode layer, where the second electrode layer is disposed over the piezoelectric layer; and etching the piezoelectric layer in a pattern of the piezoelectric actuator. Where desired, the method may further include contacting the substrate with a sacrificial layer, where the sacrificial layer is disposed over the substrate. The method may further include etching the sacrificial layer. In some instances, the sacrificial layer is etched in a pattern to allow for contacting the substrate with the first electrode layer.

In certain embodiments, the piezoelectric actuators are fabricated using Micro-Electro-Mechanical System (MEMS) fabrication techniques. Embodiments of the fabrication process are described in detail below. In some cases, the substrate includes a silicon on insulator (SOI) wafer. In certain instances, the substrate is etched using methods including, but not limited to, reactive-ion etching (RIE), deep reactive-ion etching (DIRE), the Bosch process (i.e., pulsed or time-multiplexed etching), and the like. In some cases, the electrode layers are contacted with the substrate by methods including, but not limited to, chemical vapor deposition (CVD), low pressure chemical vapor deposition (LPCVD), atmospheric pressure chemical vapor deposition (APCVD), ultrahigh vacuum chemical vapor deposition (UHVCVD), sputter deposition, cathodic arc deposition, and the like. In some cases, the piezoelectric actuators may be fabricated using sol-gel deposition, mechanical assembly, or combinations thereof.

In certain instances, the method further includes the step of contacting the substrate with a cover, where the cover is disposed over the piezoelectric actuator. In these cases, the method can further include etching the cover in a pattern of a recess. The etching may be performed before contacting the substrate with the cover. Where desired, the recess can be formed in the shape of the elongated structure. The recess can be disposed over the elongated structure of the piezoelectric actuator, such that the elongated structure does not directly contact the cover. As such, the elongated structure is free to move when the piezoelectric beams apply an actuation force to the elongated structure.

Utility

As can be seen, the subject piezoelectric actuators find use in a variety of different applications where it is desirable to provide a force or movement. In certain embodiments, the subject piezoelectric actuators find use in microfluidic devices, such as, but not limited to, microfluidic devices operating at high operating pressures and frequencies. Where desired, the subject piezoelectric actuators can be used where it is desirable to provide for amplification of the displacement of the elongated structure relative to the displacement of the piezoelectric beams. In addition, the bi-chevron configuration of the subject piezoelectric actuator may facilitate a minimization of the out-of-place displacement and bucking of the piezoelectric actuator.

The subject piezoelectric actuators also find use in applications where it is desirable to regulate the flow of a fluid. In certain embodiments, the fluid can include supercritical fluids, such as, but not limited to supercritical $CO_2$. Supercritical fluids can be used as a solvent in a wide range of industrial and laboratory processes. For instance, supercritical fluids can be used for the deposition of particles onto the surface of a substrate. The gas-like surface tension, diffusivities, and viscosities of supercritical fluids can allow access to nano pores on the surface of the substrate that are smaller than can be accessed by liquids. In addition, the liquid-like solubilities of supercritical fluids can allow for higher precursor concentrations than are typical for other deposition techniques, such as chemical vapor deposition.

In addition, embodiments of the subject piezoelectric actuators may find use where it is desirable to deposit a fluid or particles onto the surface of a substrate. In certain embodiments, the subject piezoelectric actuators find use in the preparation of coatings of a wide variety of materials for use in, e.g., pharmaceutical, agricultural, food, chemical, imaging (including photographic and printing, such as inkjet printing), cosmetics, electronics (including electronic display device applications, such as color filter arrays and organic light emitting diode display devices), data recording, catalysts, polymer (including polymer filler applications), pesticides, explosives, microstructure/nanostructure architecture building, and the like. The subject piezoelectric actuators may also find use in 3-dimensional (3-D) printing. 3-D printing is a type of additive manufacturing technology where a three dimensional object is created by the deposition of successive layers of a material. Piezoelectric actuators may be used in 3-D printers to regulate the amount of the material deposited to form the object.

The subject piezoelectric actuators may also find use in various other applications, such as, but not limited to, micro-propulsion systems. In some cases, the piezoelectric actuators find use in regulating the flow of a propellant in the micro-propulsion system. For example, the piezoelectric actuator may regulate the flow of a pressurized propellant from a reservoir, such as a propellant tank.

The piezoelectric actuators may also find use in RF switches, such as a MEMS RF switch. In the absence of an applied electric field, the piezoelectric actuator may be in an open position. Application of an electric field to the piezoelectric actuator may cause the piezoelectric actuator to move to a closed position. In some cases, one or more piezoelectric actuators can be arranged in an RF switch array. For example, piezoelectric actuators may find use as MEMS RF switches in cellular telephones, wireless computer networks, communication systems, radar systems, etc. In wireless devices, piezoelectric actuators may find use as MEMS RF switches for antenna switches, mode switches, transmit/receive switches, and the like.

Embodiments of the subject piezoelectric actuators may also find use in dither motors. A dither motor is a mechanical oscillating device that produces an oscillating back and forth (i.e., dither) movement. For example, the dither motor can include piezoelectric actuators. Application of an electric field to the piezoelectric actuators may cause the piezoelectric actuator to move the dither motor in a first direction. Removal of the electric field may cause the piezoelectric actuator, and thus the dither motor, to return to its original position. In some instances, the piezoelectric actuator is actuated at a desired actuation frequency to produce the desired oscillating movement of the dither motor. In certain embodiments, the piezoelectric actuators may find use in dither motors for ring laser gyroscopes.

As can be appreciated from the disclosure provided above, embodiments of the present invention have a wide variety of applications. Accordingly, the examples presented herein are offered for illustration purposes and are not intended to be construed as a limitation on the invention in any way. Those of ordinary skill in the art will readily recognize a variety of noncritical parameters that could be changed or modified to yield essentially similar results. Thus, the following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Celsius, and pressure is at or near atmospheric.

Examples

Fabrication Process

Figure 16:
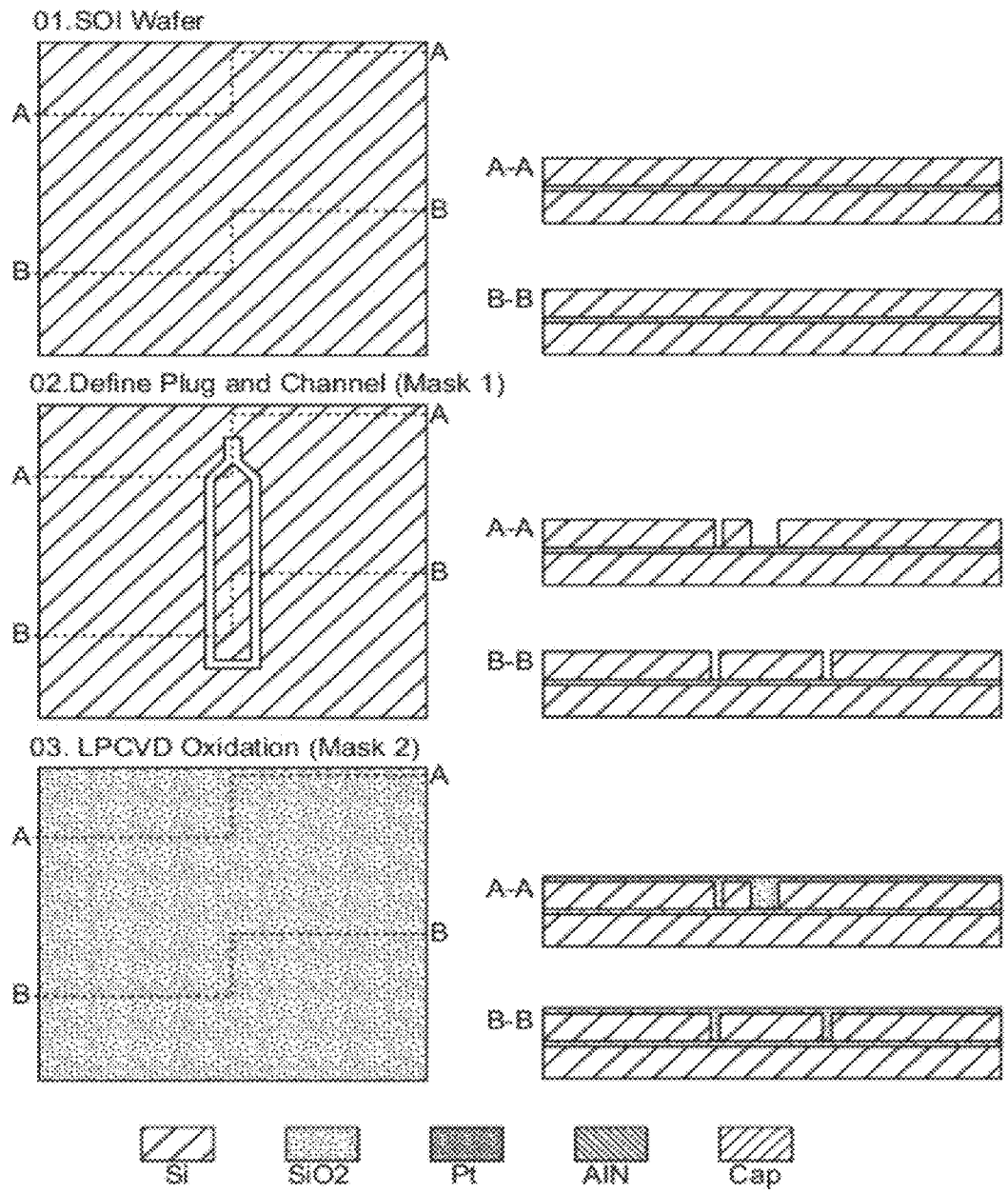
FIG. 16 shows a schematic of an embodiment of the fabrication process of the subject piezoelectric valve.
Figure 16:
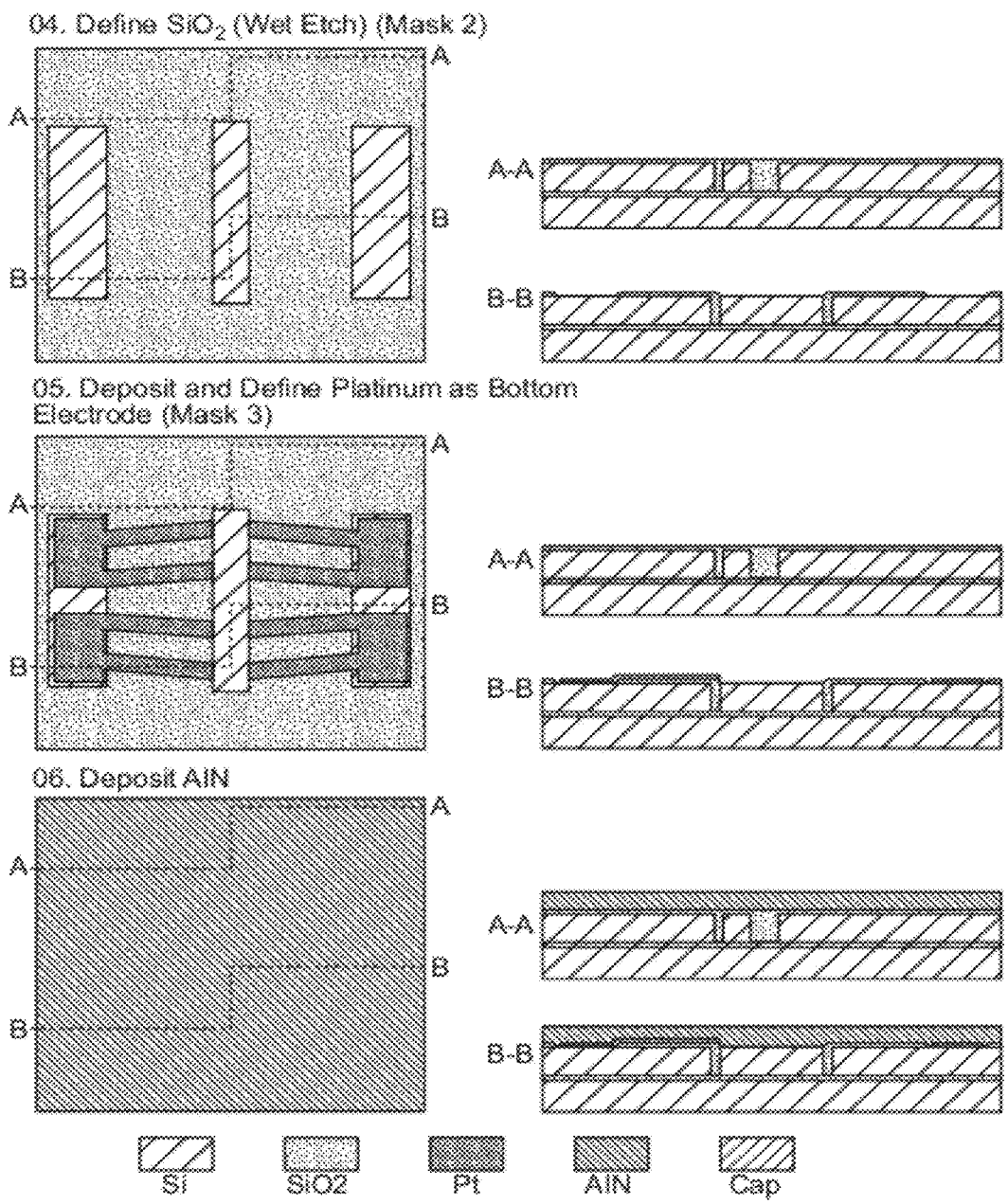
Figure 16:
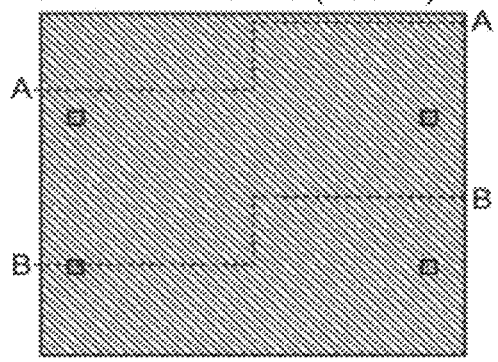
Figure 16:
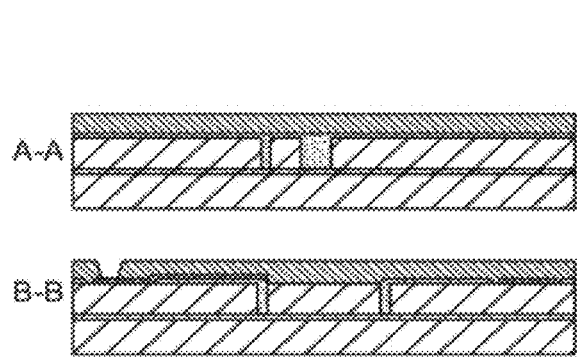
Figure 16:
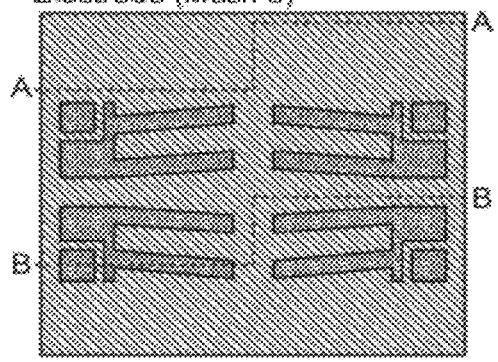
Figure 16:
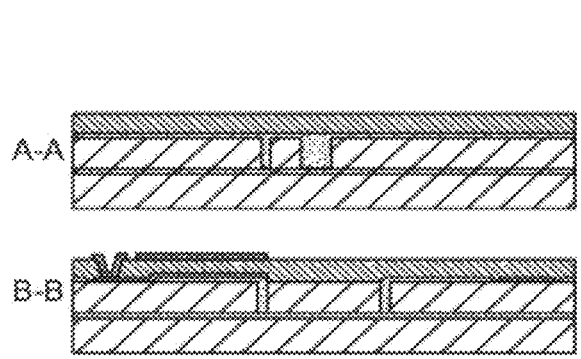
Figure 16:
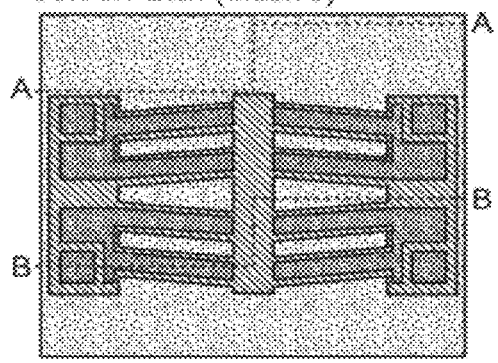
Figure 16:
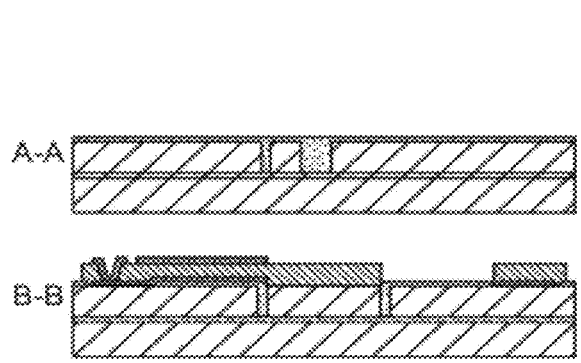
Figure 16:
Figure 16:
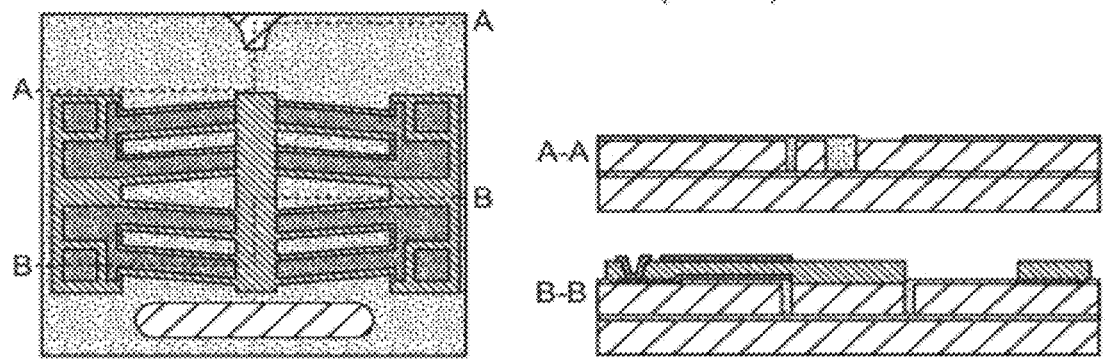
Figure 16:
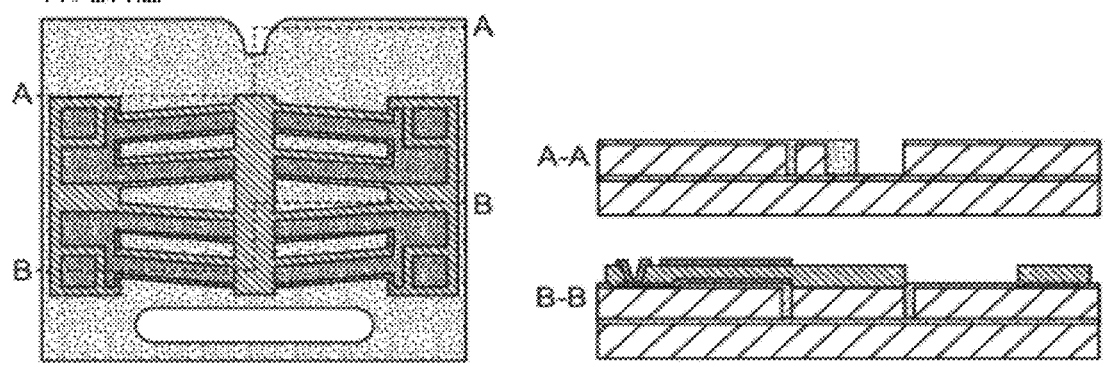
Figure 16:
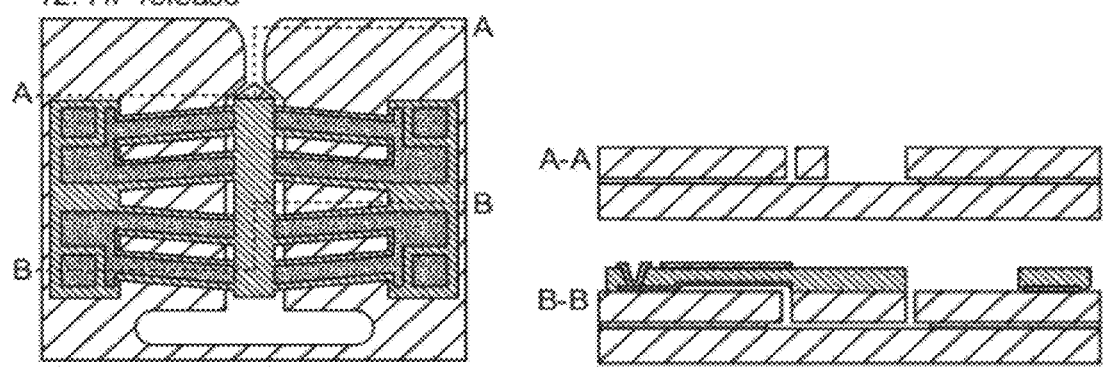
Figure 16:
Figure 16:
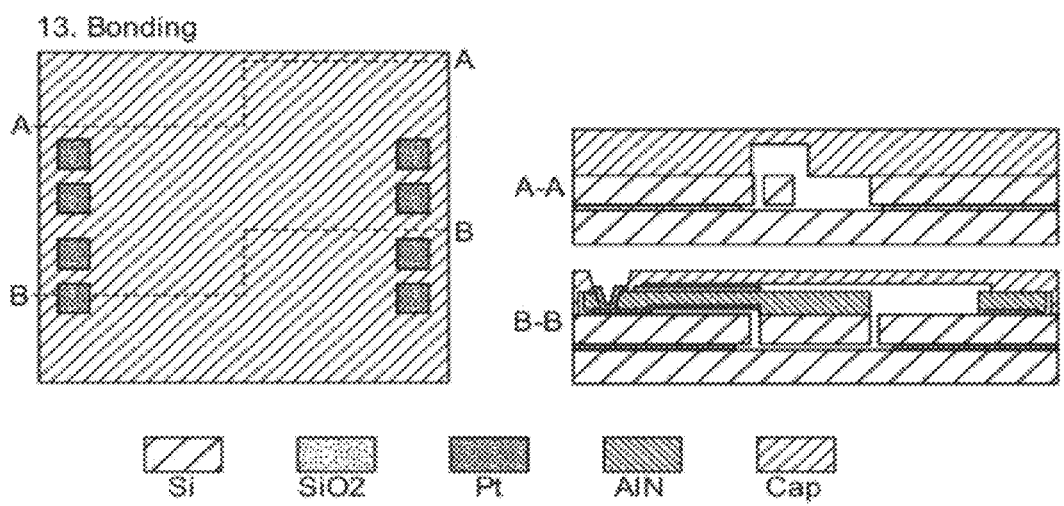

FIG. 16 shows schematics of the fabrication process of the piezoelectric valve of the present disclosure. A SOI wafer was cleaned and dried (FIG. 16, Step 01). The valve seat, elongated structure and conduit were defined by deep reactive ion etching (DRIE) (FIG. 16, Step 02). The channels were then filled with TEOS oxide, $SiO_2$, (FIG. 16, Step 03) and the $SiO_2$ layer was wet etched (FIG. 16, Step 04). The bottom electrode layer (platinum or molybdenum) was deposited and patterned (FIG. 16, Step 05). The piezoelectric layer (aluminum nitride) was deposited (FIG. 16, Step 06) and vias were patterned and etched to allow electrical contact to the bottom electrode (FIG. 16, Step 07). The top electrode layer (platinum or molybdenum) was deposited and patterned (FIG. 16, Step 08), then the piezoelectric layer was etched (FIG. 16, Step 09). The openings for the fluid attachment point and the flow channels and nozzles were patterned and etched in the top oxide (FIG. 16, Step 10), and then etched into the silicon by DRIE (FIG. 16, Step 11). Finally, the sacrificial oxide was removed using hydrofluoric acid (HF) vapor, and the elongated structure was free to move (FIG. 16, Step 12). The valve was then capped with a second wafer that was patterned with a recess over the elongated structure to allow it to move (FIG. 16, Step 13).

Figure 17:
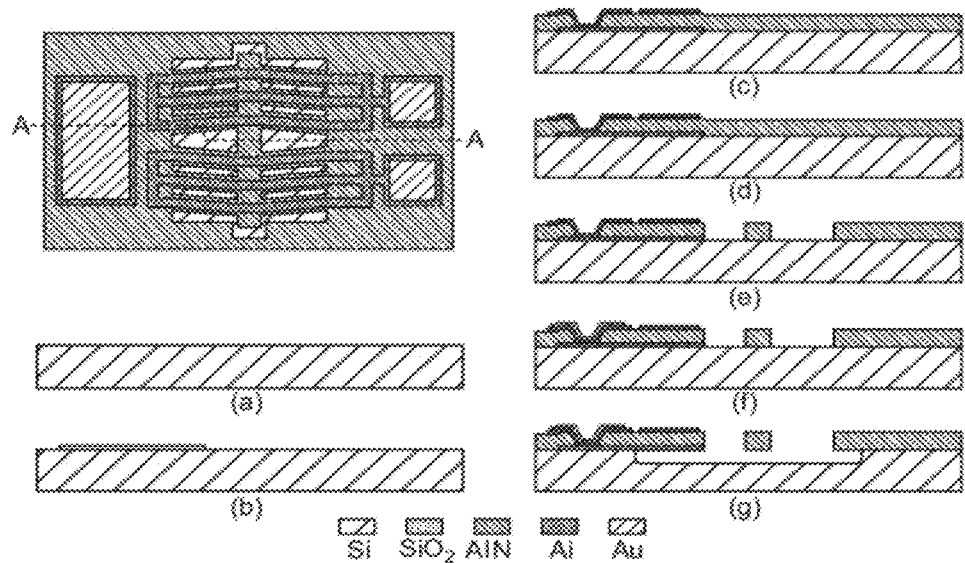
FIG. 17 shows a schematic of an embodiment of the fabrication process of the subject piezoelectric actuator.
Figure 18:
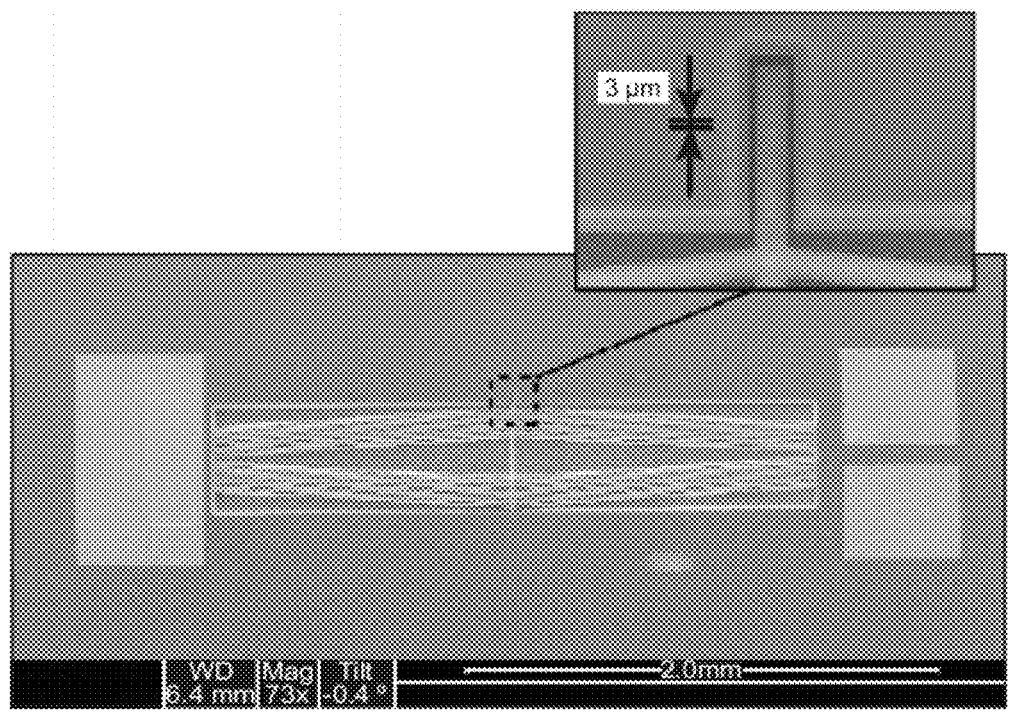
FIG. 18 shows a scanning electron microscope (SEM) image of an embodiment of the subject piezoelectric actuator with a built-in Vernier scale. The resolution of the Vernier scale was 0.6 μm.

Another fabrication process is shown in FIG. 17. A bi-chevron aluminum nitride piezoelectric actuator was fabricated with a built-in Vernier scale for actuation stroke measurement. The fabrication process of the aluminum nitride actuator is as shown in FIG. 17. First, the bottom electrode (aluminum, Al) was deposited and defined on a high resistivity wafer (FIG. 17(a)-(b)). Next, a 1 μm aluminum nitride layer was deposited and an aluminum nitride via wet etch was performed for electrical connection between top electrode and bottom electrode (FIG. 17(c)). After this, the top electrode (Al) was deposited and defined (FIG. 17(d)) and the aluminum nitride layer was etched to define the shape of the actuator (FIG. 17(e)). Finally, a gold layer (Au) was deposited to increase the durability of the electrical contacts (FIG. 17(f)) and the elongated structure was released (FIG. 17(g)). A scanning electron microscope (SEM) image of the subject piezoelectric actuator is shown in FIG. 18. The piezoelectric actuator was fabricated with a built-in Vernier scale. The resolution of the Vernier scale was 0.6 μm.

Single Cell and System Design

A supercritical $CO_2$ valve (SCV) as shown in FIG. 7 was designed. The dimensions of the SCV are shown in FIG. 7. The final size of the SCV was approximately 264 μm×2010 μm. An enlarged schematic of the valve seat is shown in FIG. 8. The thickness of the elongated structure was 10 μm. The gap between the elongated structure and the walls of the conduit where the fluid flows was 2 μm. Thus, there were two fluid flow channels, one on either side of the elongated structure. The piezoelectric beams were made from aluminum nitride. Upon actuation, the aluminum nitride piezoelectric beams moved the elongated structure approximately 1.2 μm in each direction when the length of the aluminum nitride beam was 700 μm and the actuating electric field was half of the breakdown electric field. The difference between the displacement of the elongated structure and the valve seat was used to apply additional sealing force.

The piezoelectric valve was fabricated in a "half-open" state (i.e., in the absence of an applied electric field, the elongated structure was positioned at a point between maximum extension and maximum retraction of the elongated structure relative to the valve seat). The total displacement of the elongated structure from open to close was 2 μm. Because there were two fluid flow channels around the elongated structure and the thickness of the elongated structure was 10 μm, the open flow area was 40 μm². Thus, the piezoelectric valve was configured to have a 10 mg/sec flow rate for supercritical $CO_2$. If a higher flow rate is desired, two supercritical $CO_2$ valves can be combined such that the two valves are in fluid communication with a single nozzle, as shown in FIG. 11.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the embodiments shown and described herein. Rather, the scope and spirit of present invention is embodied by the appended claims.

That which is claimed is:

1. A piezoelectric actuator comprising:
   an elongated structure having a first end and a second end;
   a first set of opposing piezoelectric beams each coupled at a first end to a first region of the elongated structure and at a second end to a fixed support; and
   a second set of opposing piezoelectric beams each coupled at a first end to a second region of the elongated structure and at a second end to a fixed support;
   wherein the orientation of the first set of opposing piezoelectric beams is opposite the orientation of the second set of opposing piezoelectric beams relative to the elongated structure, and the first and second sets of opposing piezoelectric beams are configured to move the elongated structure along its longitudinal axis upon application of an electric field.

2. The piezoelectric actuator according to claim 1, wherein the first and second sets of opposing piezoelectric beams are configured to move the elongated structure along its longitudinal axis in a manner dependent on the direction of the applied electric field and the polarization of the first and second sets of opposing piezoelectric beams.

3. The piezoelectric actuator according to claim 2, wherein the first and second sets of opposing piezoelectric beams are configured to move the elongated structure along its longitudinal axis:
   in a forward direction when the direction of the applied electric field is opposite the direction of polarization of the first set of opposing piezoelectric beams and in the same direction as the direction of polarization of the second set of opposing piezoelectric beams; and
   in a reverse direction when the direction of the applied electric field is in the same direction as the direction of polarization of the first set of opposing piezoelectric beams and opposite the direction of polarization of the second set of opposing piezoelectric beams.

4. The piezoelectric actuator according to claim 1, wherein each of the piezoelectric beams is coupled to an electrode.

5. The piezoelectric actuator according to claim 1, wherein each set of piezoelectric beams comprises two or more piezoelectric beams.

6. The piezoelectric actuator according to claim 1, wherein each of the piezoelectric beams is coupled to the elongated structure at an acute angle as measured between the piezoelectric beam and a line perpendicular to the longitudinal axis of the elongated structure.

7. The piezoelectric actuator according to claim 6, wherein the acute angle ranges from 1° to 10°.

8. The piezoelectric actuator according to claim 1, wherein the piezoelectric beams comprise aluminum nitride.

9. The piezoelectric actuator according to claim 1, wherein each of the piezoelectric beams has a length ranging from 50 to 2000 µm.

10. The piezoelectric actuator according to claim 9, wherein each of the piezoelectric beams has a length of 700 µm.

11. The piezoelectric actuator according to claim 1, wherein the piezoelectric actuator has a maximum out-of-plane displacement of 0.1 µm or less.

12. The piezoelectric actuator according to claim 1, wherein the piezoelectric actuator is configured to move along the longitudinal axis with substantially no out-of-plane displacement.

13. The piezoelectric actuator according to claim 1, wherein the first set of opposing piezoelectric beams are angled towards the first end of the elongated structure, and the second set of opposing piezoelectric beams are angled towards the second end of the elongated structure.

14. The piezoelectric actuator according to claim 1, wherein the first set of opposing piezoelectric beams are angled towards the second end of the elongated structure, and the second set of opposing piezoelectric beams are angled towards the first end of the elongated structure.

15. The piezoelectric actuator according to claim 6, wherein the first and second sets of opposing piezoelectric beams are angled in opposite directions.

16. The piezoelectric actuator according to claim 1, wherein the first and second sets of opposing piezoelectric beams are configured to expand and contract in a length direction.

17. The piezoelectric actuator according to claim 1, wherein the first set of piezoelectric beams comprises two or more piezoelectric beams.

18. The piezoelectric actuator according to claim 1, wherein the second set of piezoelectric beams comprises two or more piezoelectric beams.

* * * * *